(12) United States Patent
Kwon et al.

(10) Patent No.: US 9,748,234 B2
(45) Date of Patent: Aug. 29, 2017

(54) SEMICONDUCTOR DEVICES AND METHODS OF FABRICATING THE SAME

(71) Applicants: Kee Sang Kwon, Seoul (KR); Boun Yoon, Seoul (KR); Sangjine Park, Yongin-si (KR); Myunggeun Song, Yongin-si (KR); Ki-Hyung Ko, Yongin-si (KR); Jiwon Yun, Hwaseong-si (KR)

(72) Inventors: Kee Sang Kwon, Seoul (KR); Boun Yoon, Seoul (KR); Sangjine Park, Yongin-si (KR); Myunggeun Song, Yongin-si (KR); Ki-Hyung Ko, Yongin-si (KR); Jiwon Yun, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/826,811

(22) Filed: Aug. 14, 2015

(65) Prior Publication Data
US 2016/0064378 A1   Mar. 3, 2016

(30) Foreign Application Priority Data
Sep. 2, 2014   (KR) .................. 10-2014-0116402

(51) Int. Cl.
| | |
|---|---|
| *H01L 29/78* | (2006.01) |
| *H01L 27/088* | (2006.01) |
| *H01L 29/66* | (2006.01) |
| *H01L 21/8234* | (2006.01) |
| *H01L 29/49* | (2006.01) |
| *H01L 29/51* | (2006.01) |

(52) U.S. Cl.
CPC .... *H01L 27/0886* (2013.01); *H01L 21/82345* (2013.01); *H01L 27/088* (2013.01); *H01L 29/66545* (2013.01); *H01L 29/785* (2013.01); *H01L 29/7831* (2013.01); *H01L 29/4966* (2013.01); *H01L 29/513* (2013.01); *H01L 29/517* (2013.01)

(58) Field of Classification Search
CPC ............ H01L 21/82345; H01L 27/088; H01L 27/0886; H01L 29/785; H01L 29/66545; H01L 29/7831; H01L 29/4966; H01L 29/513; H01L 29/517
USPC ........................................................ 257/401
See application file for complete search history.

(56) References Cited

U.S. PATENT DOCUMENTS

| | | | |
|---|---|---|---|
| 8,193,641 | B2 | 6/2012 | Rachmady et al. |
| 8,278,201 | B2 | 10/2012 | Jang |
| 8,334,570 | B2 | 12/2012 | Xu et al. |

(Continued)

*Primary Examiner* — Asok K Sarkar
*Assistant Examiner* — Dmitriy Yemelyanov
(74) *Attorney, Agent, or Firm* — Myers Bigel, P.A.

(57) ABSTRACT

Semiconductor devices may include a substrate, gate electrodes on the substrate, and source/drain regions at both sides of each of the gate electrodes. Each of the gate electrodes may include a gate insulating pattern on the substrate, a lower work-function electrode pattern that is on the gate insulating pattern and has a recessed upper surface, and an upper work-function electrode pattern that conformally extends on the recessed upper surface of the lower work-function electrode pattern. Topmost surfaces of the lower work-function electrode patterns may be disposed at an equal level, and the upper work-function electrode patterns may have different thicknesses from each other.

18 Claims, 44 Drawing Sheets

(56) References Cited

U.S. PATENT DOCUMENTS

| | | |
|---|---|---|
| 8,765,591 B2 | 7/2014 | Fu et al. |
| 2011/0147831 A1 | 6/2011 | Steigerwald et al. |
| 2012/0129331 A1* | 5/2012 | Choi ................. H01L 21/28088 438/592 |
| 2012/0256276 A1 | 10/2012 | Hwang et al. |
| 2012/0292715 A1 | 11/2012 | Hong et al. |
| 2012/0319205 A1 | 12/2012 | Hempel et al. |
| 2013/0092984 A1 | 4/2013 | Liu et al. |
| 2013/0187236 A1* | 7/2013 | Xie .................... H01L 29/4966 257/369 |
| 2014/0004692 A1 | 1/2014 | Wei et al. |

* cited by examiner

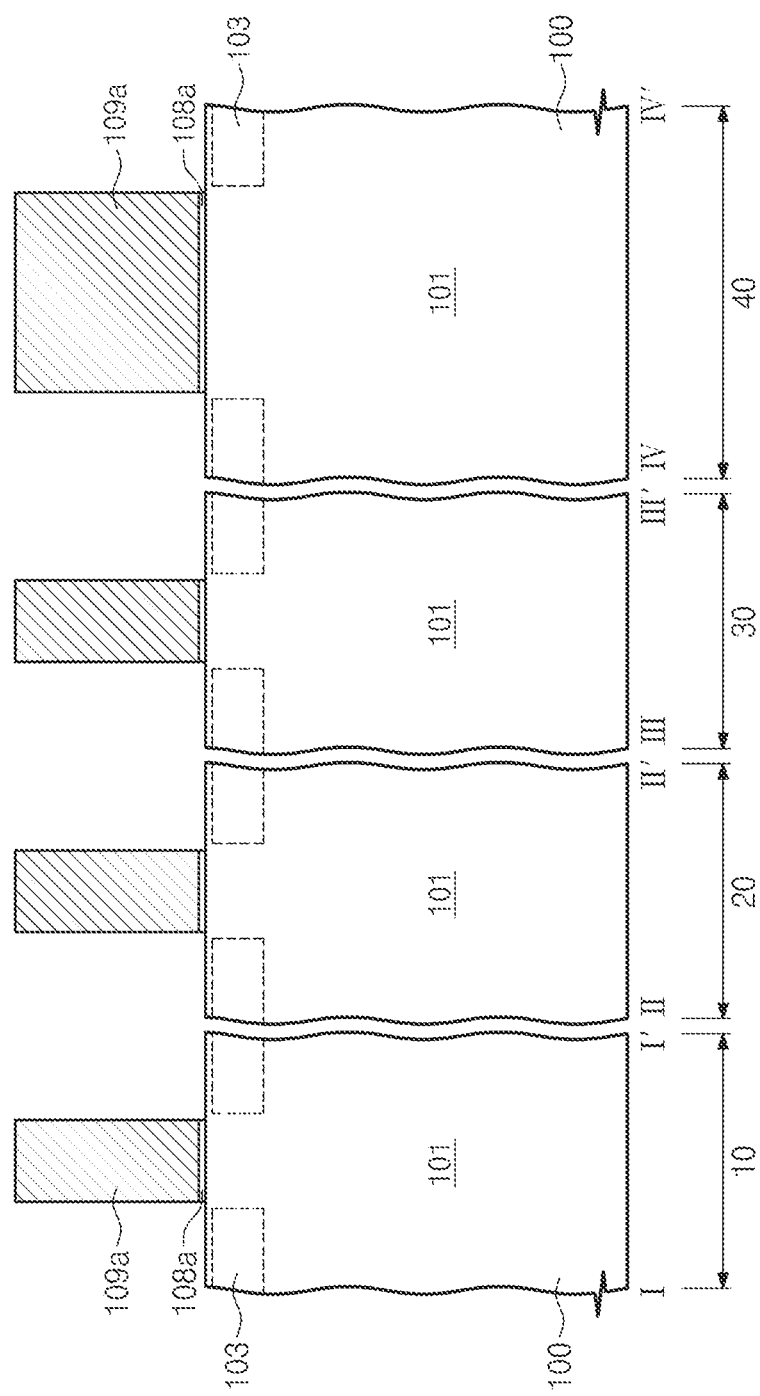

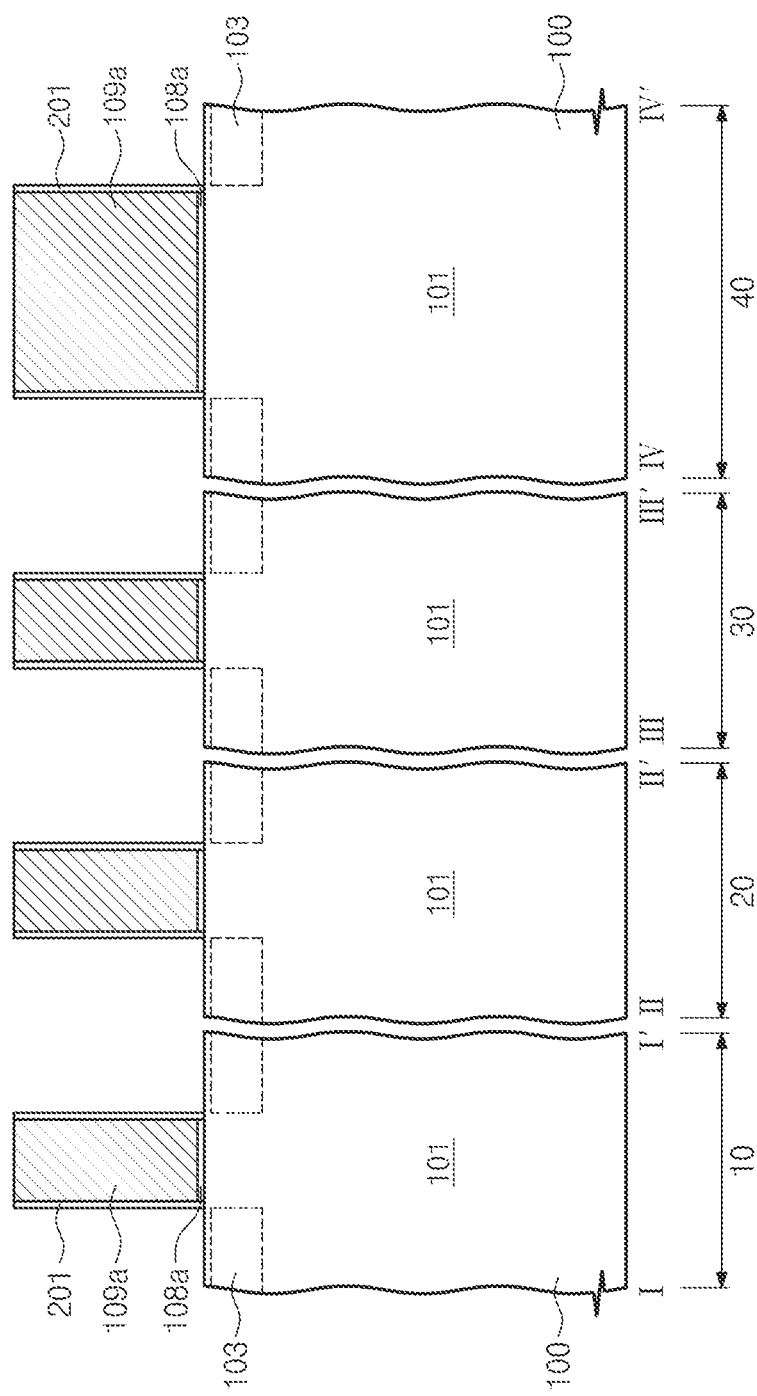

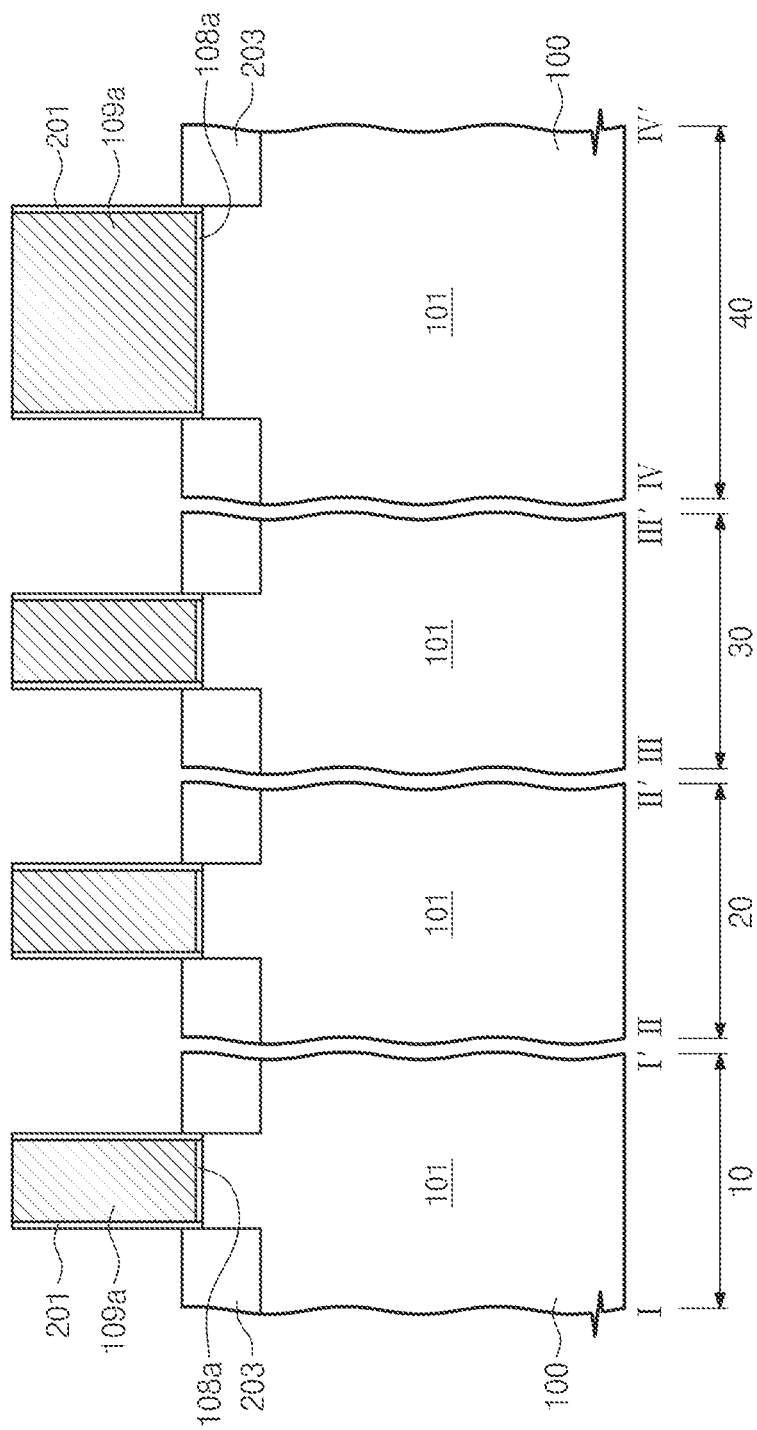

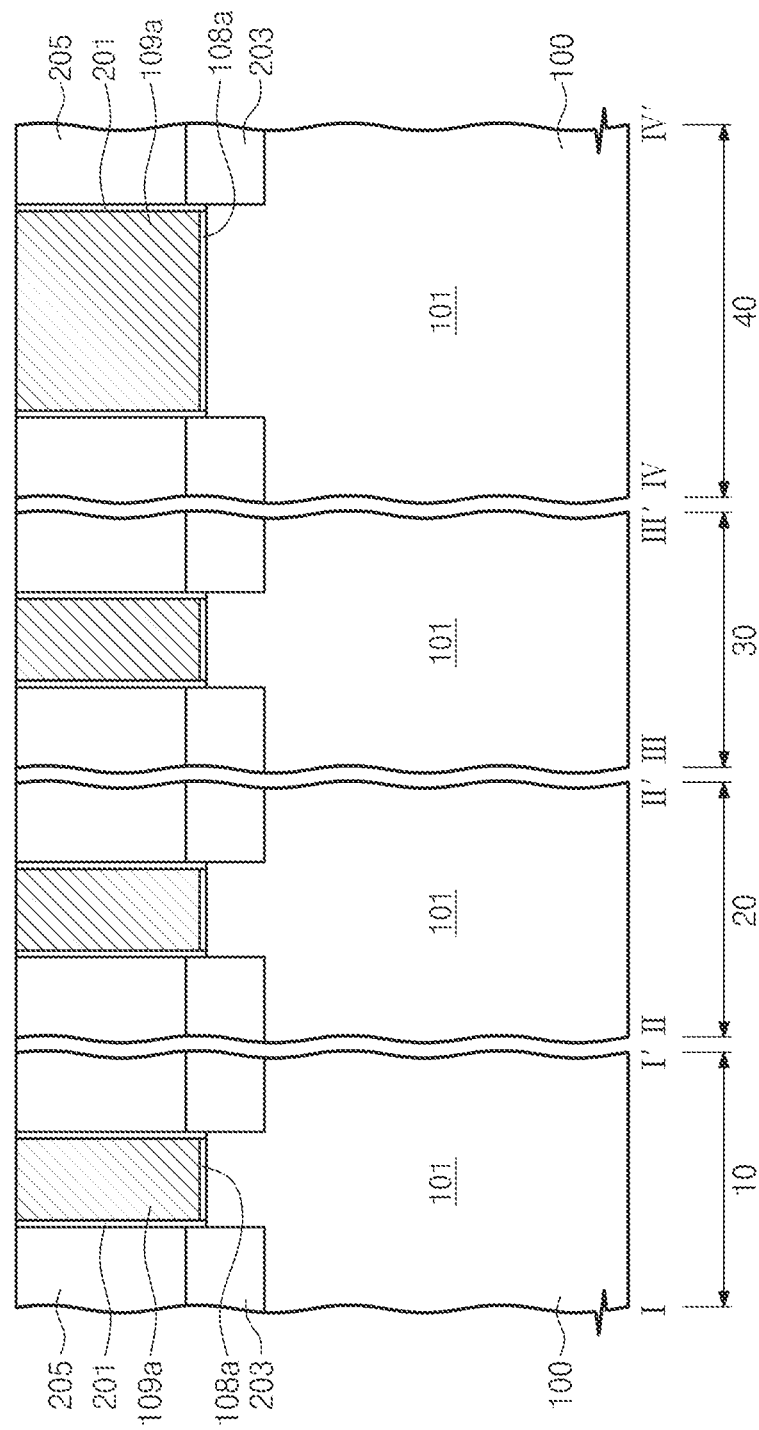

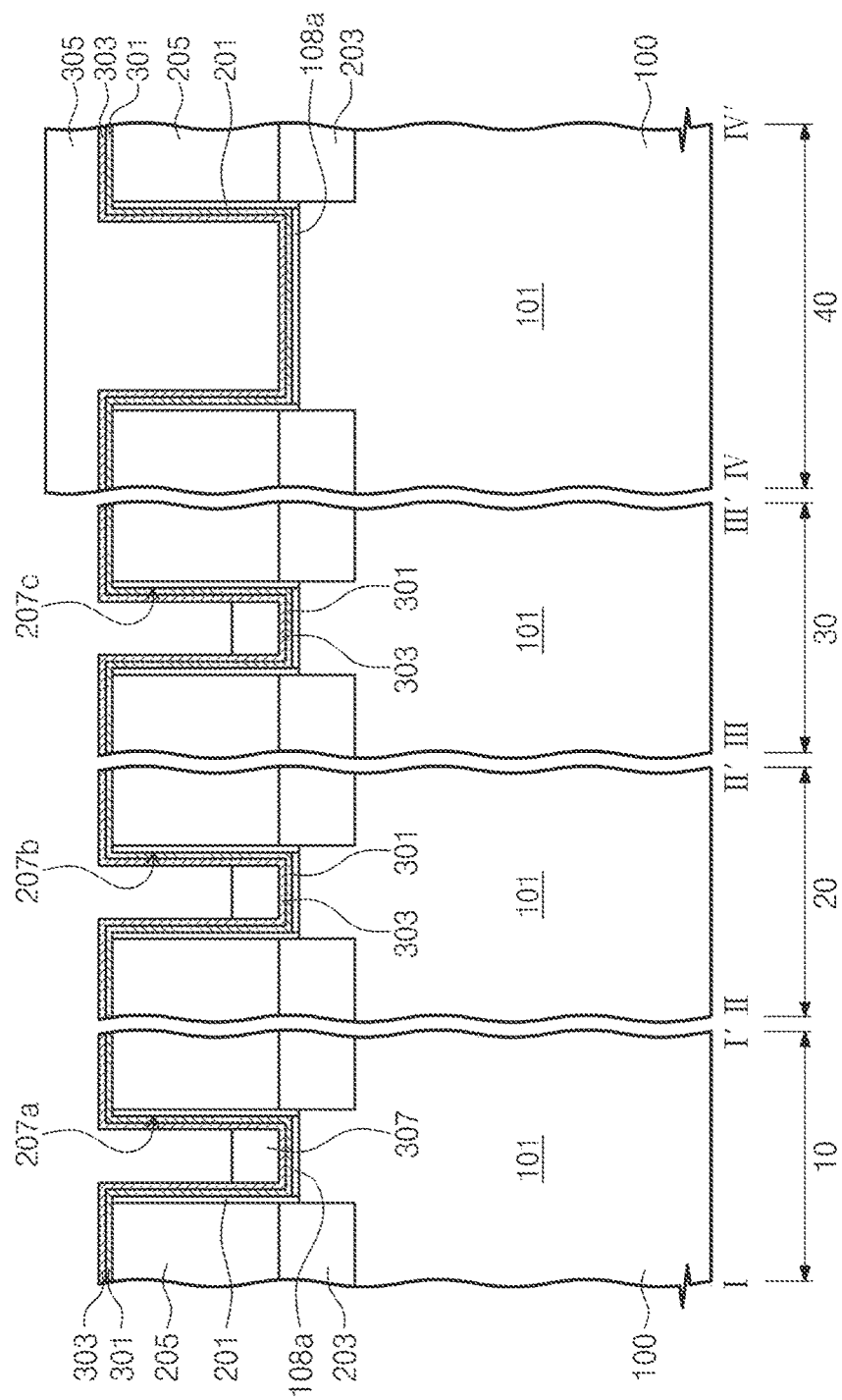

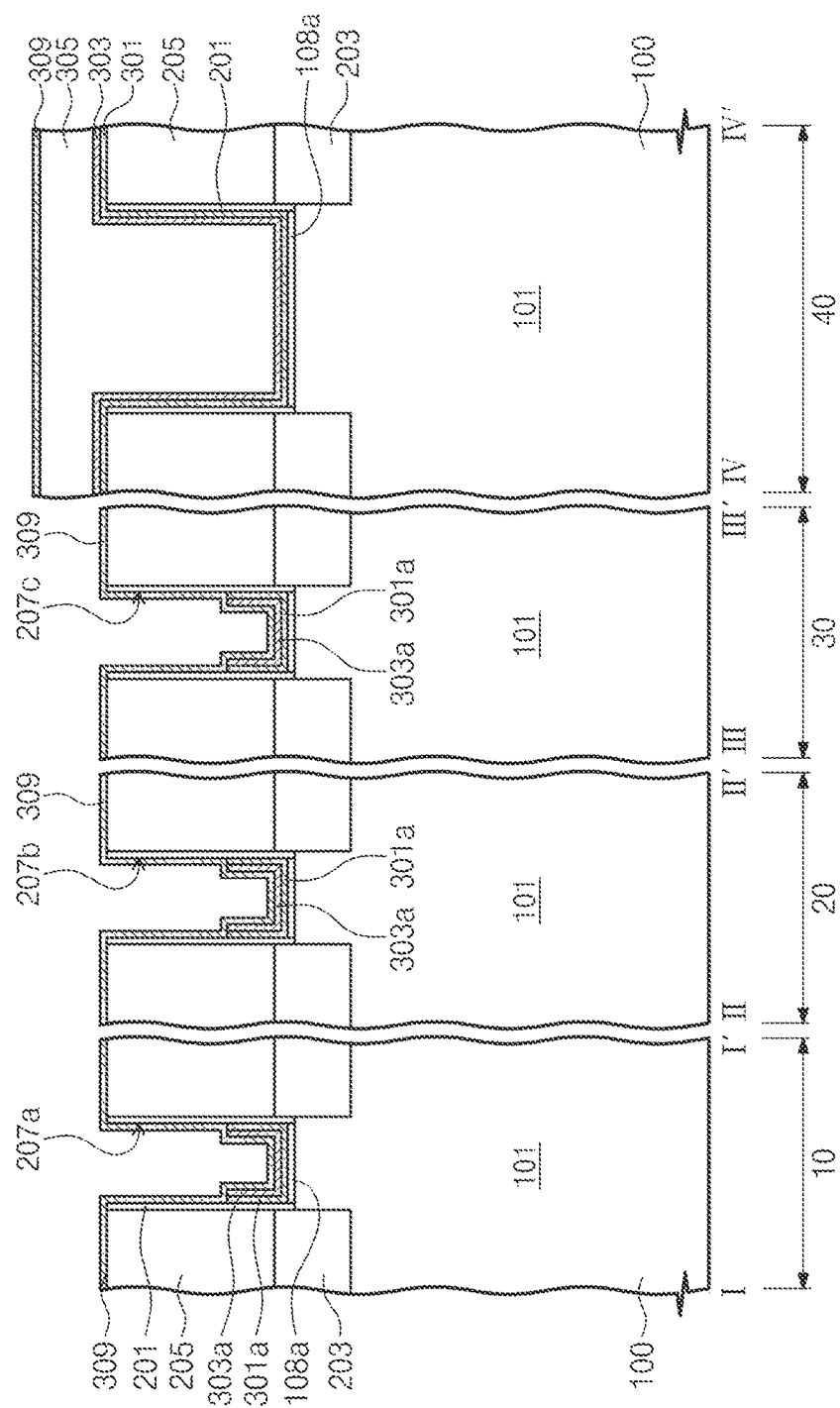

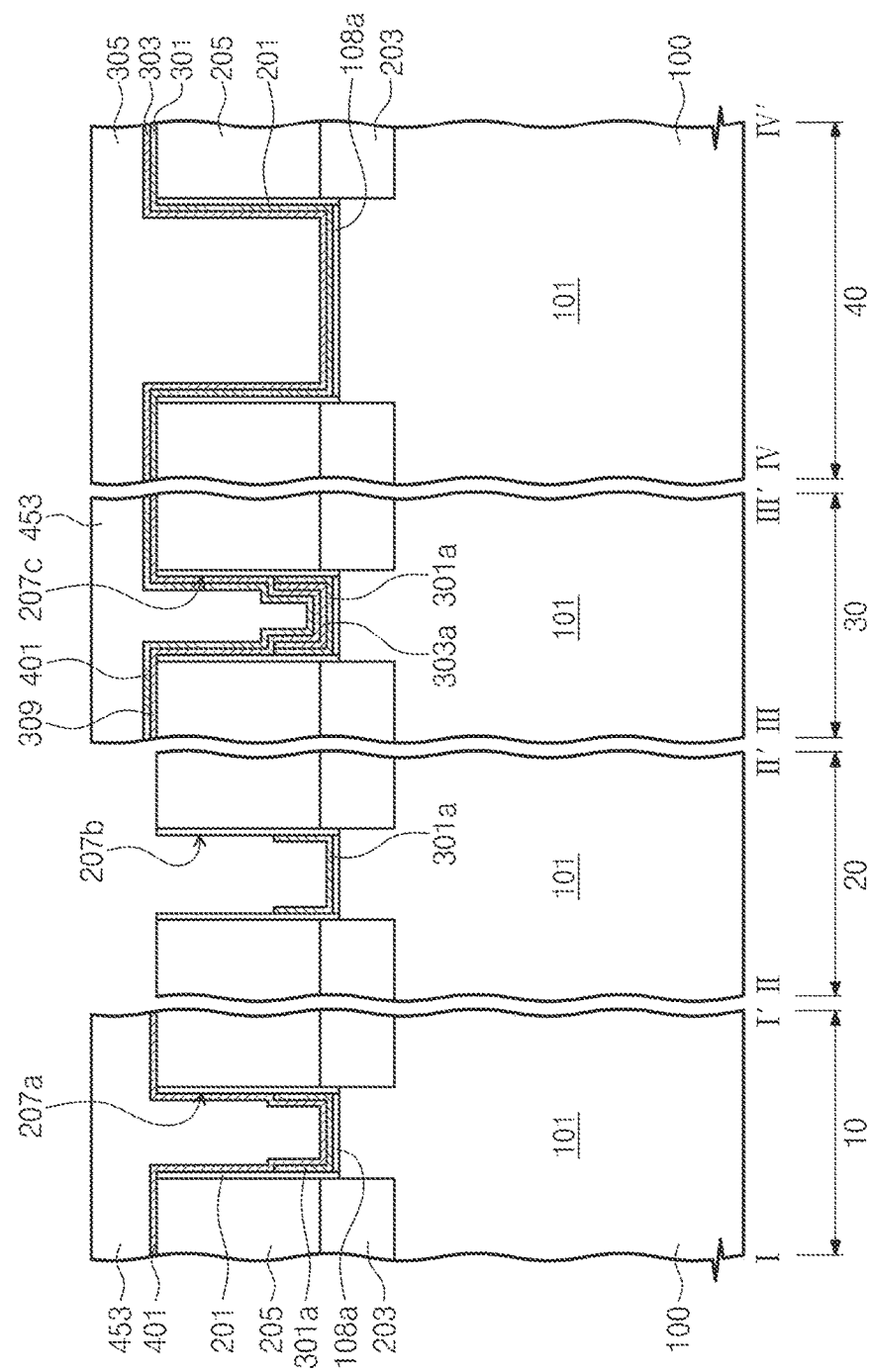

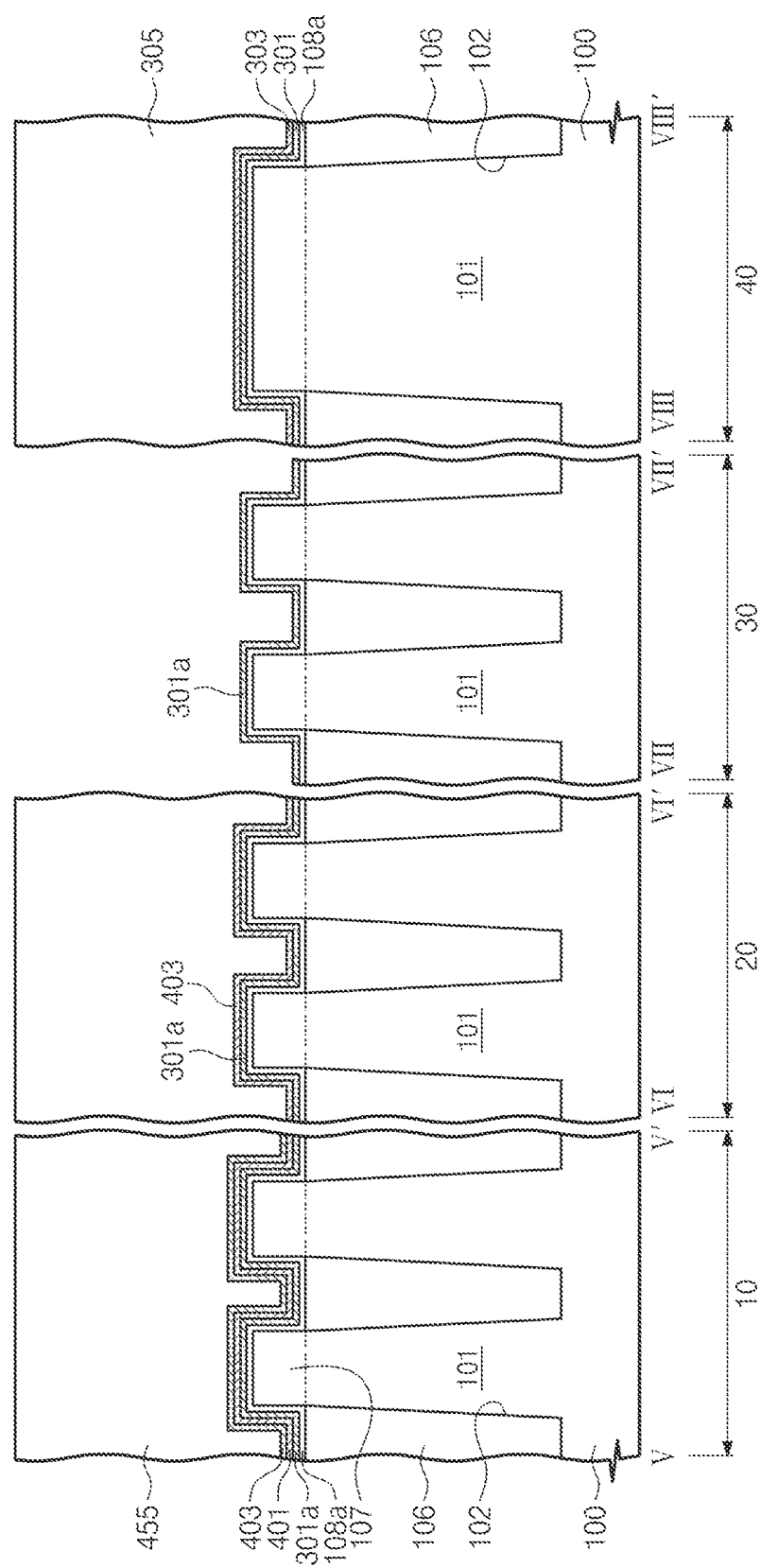

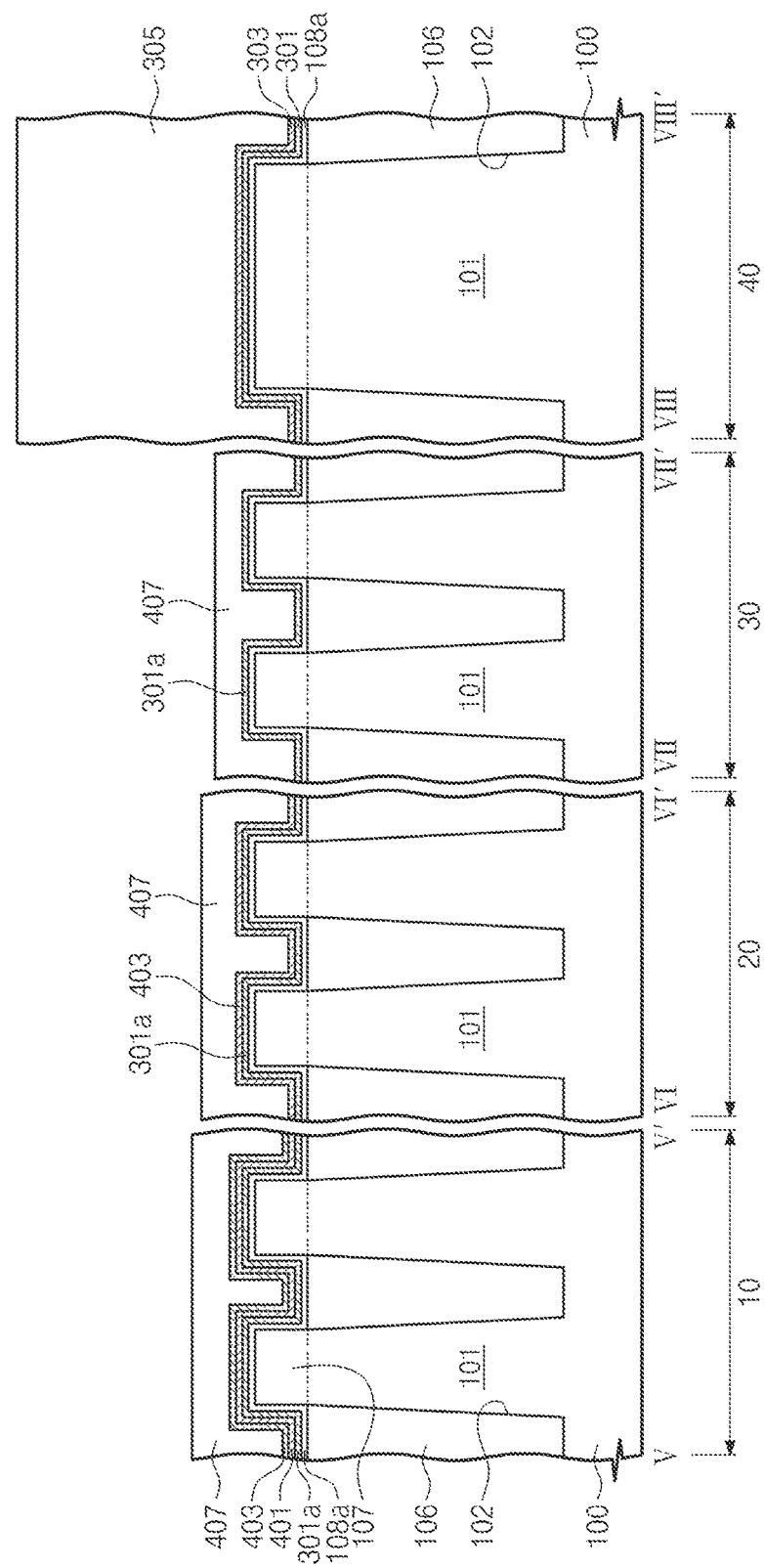

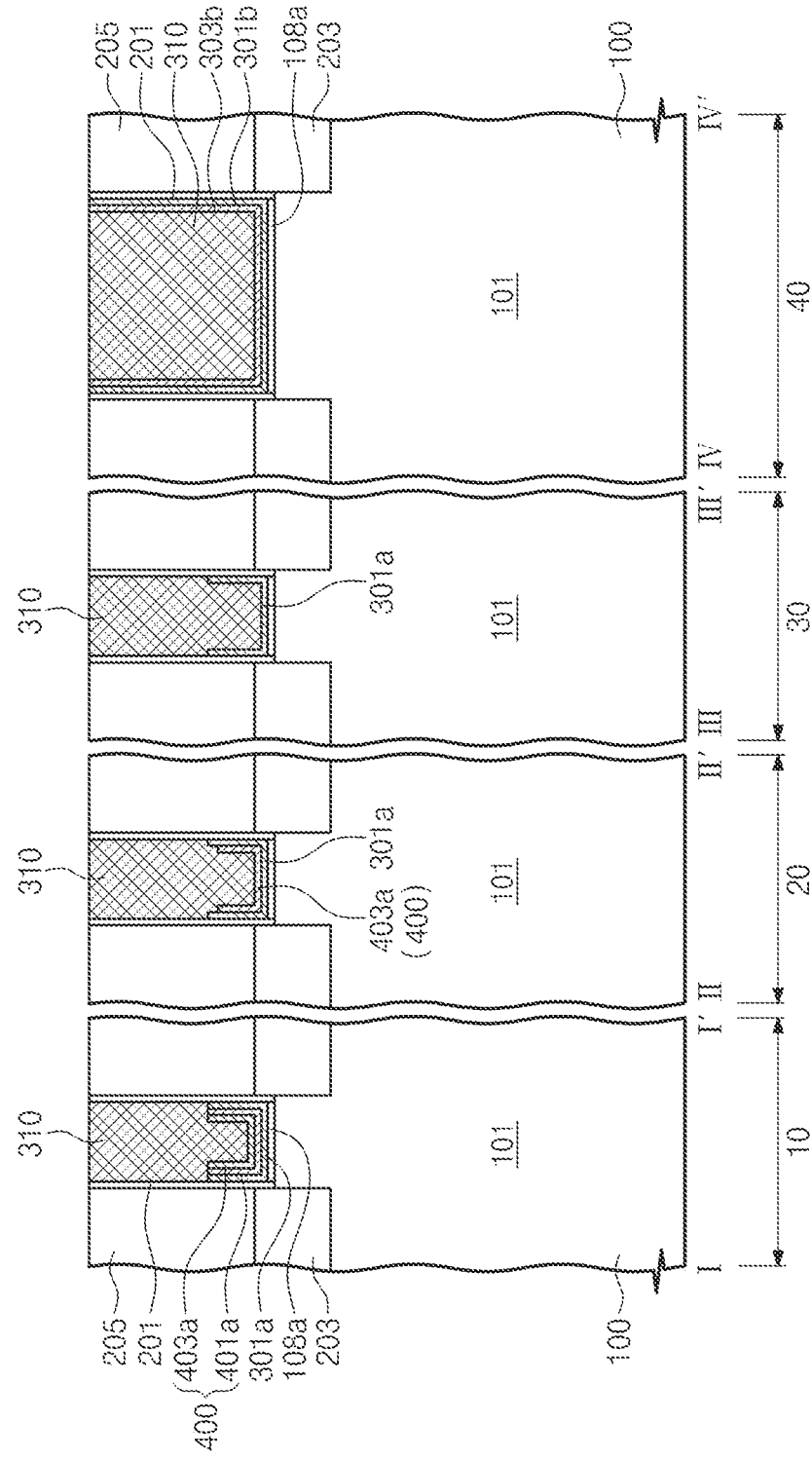

SEMICONDUCTOR DEVICES AND METHODS OF FABRICATING THE SAME

CROSS-REFERENCE TO RELATED APPLICATION

This U.S. non-provisional patent application claims priority under 35 U.S.C. §119 to Korean Patent Application No. 10-2014-0116402, filed on Sep. 2, 2014, in the Korean Intellectual Property Office, the disclosure of which is hereby incorporated by reference in its entirety.

BACKGROUND

The inventive concept relates to semiconductor devices and methods of fabricating the semiconductor devices. More particularly, the inventive concept relate to semiconductor devices including a fin field effect transistor (fin-FET) and methods of fabricating the same.

A semiconductor device may be an integrated circuit including metal-oxide-semiconductor field effect transistors (MOSFETs). As sizes and design rules of semiconductor devices have been reduced, sizes of MOSFETs have also been reduced. Thus, widths of gate electrodes of MOSFETs have been reduced and aspect ratios of the gate electrodes have been increased.

Gate electrodes may include gate metal layers having different thicknesses to form MOSFETs of varying performance.

SUMMARY

Embodiments of the inventive concept may provide a semiconductor device with improved reliability.

A semiconductor device may include a substrate, a plurality of gate electrodes disposed on the substrate and source/drain regions disposed at both sides of each of the plurality of gate electrodes. Each of the plurality of gate electrodes may include a gate insulating pattern disposed on the substrate, a lower work-function electrode pattern disposed on the gate insulating pattern and including a recessed upper surface, and an upper work-function electrode pattern conformally extending on the recessed upper surface of the lower work-function electrode pattern. Topmost surfaces of the lower work-function electrode patterns may be disposed at an equal level, and the upper work-function electrode patterns may have different thicknesses from each other.

According to various embodiments, the substrate may include a first region and a second region, and the plurality of gate electrodes may include a first gate electrode and a second gate electrode that are disposed on the first region and the second region, respectively.

In various embodiments, a topmost surface of the upper work-function electrode pattern of the first gate electrode may be disposed at a different level from a topmost surface of the upper work-function electrode pattern of the second gate electrode.

In various embodiments, the topmost surface of the upper work-function electrode pattern of the first gate electrode may be disposed at an equal level to the topmost surface of the lower work-function electrode pattern of the first gate electrode. The topmost surface of the upper work-function electrode pattern of the second gate electrode may be lower than the topmost surface of the lower work-function electrode pattern of the second gate electrode.

According to various embodiments, the upper work-function electrode pattern of the first gate electrode may extend onto the topmost surface of the lower work-function electrode pattern of the first gate electrode.

In various embodiments, a topmost surface of the upper work-function electrode pattern of the first gate electrode may be disposed at an equal level to a topmost surface of the upper work-function electrode pattern of the second gate electrode.

According to various embodiments, the topmost surface of the upper work-function electrode pattern of each of the first and second gate electrodes may be disposed at an equal level to the topmost surface of the lower work-function electrode pattern of each of the first and second gate electrodes.

In various embodiments, the topmost surface of the upper work-function electrode pattern of each of the first and second gate electrodes may be lower than the topmost surface of the lower work-function electrode pattern of each of the first and second gate electrodes.

According to various embodiments, the upper work-function electrode patterns of the first and second gate electrodes may cover the topmost surfaces of the lower work-function electrode patterns of the first and second gate electrodes, respectively.

In various embodiments, the upper work-function electrode pattern of the first gate electrode may be thicker than the upper work-function electrode pattern of the second gate electrode.

According to various embodiments, the semiconductor device may further include an additional gate electrode disposed on a third region of the substrate. The additional gate electrode may include a work-function electrode pattern having a recessed upper surface, and a bottom surface of the work-function electrode pattern of the additional gate electrode may be disposed at an equal level to bottom surfaces of the lower work-function electrode patterns of the first and second gate electrodes. A topmost surface of the work-function electrode pattern of the additional gate electrode may be higher than the topmost surfaces of the lower work-function electrode patterns of the first and second gate electrodes.

In various embodiments, each of the plurality of gate electrodes further may include a metal electrode pattern, and the metal electrode pattern may be disposed on the upper work-function electrode pattern and may be in contact with the upper work-function electrode pattern.

A semiconductor device may include a substrate, a device isolation layer disposed in the substrate to define a plurality of active regions, a plurality of gate electrodes on the substrate and source/drain regions disposed at both sides of each of the plurality of gate electrodes. The plurality of active regions may include a plurality of fins that have upper surfaces higher than an upper surface of the device isolation layer, and each of the plurality of gate electrodes may cross over at least one of the plurality of fin. Each of the plurality of gate electrodes may include a gate insulating pattern disposed on the substrate, a lower work-function electrode pattern disposed on the gate insulating pattern and having a recessed upper surface and an upper work-function electrode pattern conformally extending on the recessed upper surface of the lower work-function electrode pattern. Topmost surfaces of the lower work-function electrode patterns may be disposed at an equal level, and the upper work-function electrode patterns may have different thicknesses from each other.

In various embodiments, the substrate may include a first region and a second region, and the plurality of gate electrodes may include a first gate electrode on the first region of the substrate and a second gate electrode on the second region of the substrate.

According to various embodiments, the substrate further may include a third region, and the semiconductor device further may include an additional gate electrode on the third region.

According to various embodiments, the additional gate electrode may include a metal electrode pattern and a work-function electrode pattern having a recessed upper surface. A bottom surface of the work-function electrode pattern of the additional gate electrode and a bottom surface the lower work-function electrode pattern of the first gate electrode may be at an equal level, and a topmost surface of the work-function electrode pattern of the additional gate electrode and the topmost surface of the lower work-function electrode pattern of the first gate electrode may be at an equal level. The metal electrode pattern disposed of the additional gate electrode may be in direct contact with the work-function electrode pattern of the additional gate electrode.

In various embodiments, a topmost surface of the upper work-function electrode pattern of the first gate electrode may be disposed at a different level from a topmost surface of the upper work-function electrode pattern of the second gate electrode.

According to various embodiments, a topmost surface of the upper work-function electrode pattern of the first gate electrode may be disposed at an equal level to the topmost surface of the lower work-function electrode pattern of the first gate electrode.

According to various embodiments, the upper work-function electrode pattern of the first gate electrode may extend onto the topmost surface of the lower work-function electrode pattern of the first gate electrode such that a topmost surface of the upper work-function electrode pattern of the first gate electrode may be higher than the topmost surface of the lower work-function electrode pattern of the first gate electrode.

A semiconductor device may include a substrate including a first region and a second region, a plurality of gate electrodes on the substrate and source/drain regions disposed at both sides of each of the plurality of gate electrodes. Each of the plurality of gate electrodes may include a gate insulating pattern disposed on the substrate, a lower work-function electrode pattern disposed on the gate insulating pattern and having a recessed upper surface and an upper work-function electrode pattern conformally extending on the recessed upper surface of the lower work-function electrode pattern. The plurality of gate electrodes may include a first gate electrode disposed on the first region of the substrate and a second gate electrode disposed on the second region of the substrate. A first width between opposing inner sidewalls of the upper work-function electrode pattern of the first gate electrode may be smaller than a second width between opposing inner sidewalls of the upper work-function electrode pattern of the second gate electrode. A first height between a topmost surface and a bottom surface of the upper work-function electrode pattern of the first gate electrode may be greater than a second height between a topmost surface and a bottom surface of the upper work-function electrode pattern of the second gate electrode.

A semiconductor device may include a first gate electrode on a substrate and a second gate electrode on the substrate. The first gate electrode may include a first gate insulating pattern, a first lower work-function electrode pattern, a first upper work-function electrode pattern and a first metal electrode pattern that are sequentially stacked on the substrate. The first lower work-function electrode pattern may include a recessed upper surface, the first upper work-function electrode pattern may extend along the recessed upper surface of the first lower work-function electrode pattern thereby defining a first recess therein, and the first metal electrode pattern may include a lower portion in the first recess. The second gate electrode may include a second gate insulating pattern, a second lower work-function electrode pattern, a second upper work-function electrode pattern and a second metal electrode pattern that are sequentially stacked on the substrate. The second lower work-function electrode pattern may include a recessed upper surface, the second upper work-function electrode pattern may extend along the recessed upper surface of the second lower work-function electrode pattern thereby defining a second recess therein, and the second metal electrode pattern may include a lower portion in the second recess. Uppermost surfaces of the first lower work-function electrode pattern and uppermost surfaces of the second lower work-function electrode pattern may be at equal heights. A width of the lower portion of the first metal electrode pattern in the first recess may be less than a width of the lower portion of the second metal electrode pattern in the second recess, and a lowermost surface of the lower portion of the first metal electrode pattern in the first recess may be higher than a lowermost surface of the lower portion of the second metal electrode pattern in the second recess relative to an upper surface of the substrate.

In various embodiments, the first lower work-function electrode pattern and the first metal electrode pattern may include a sidewall of the first gate electrode, and the second lower work-function electrode pattern and the second metal electrode pattern may include a sidewall of the second gate electrode.

According to various embodiments, the first metal electrode pattern may contact the uppermost surfaces of the first lower work-function electrode pattern, and the second metal electrode pattern may contact the uppermost surfaces of the second lower work-function electrode pattern.

In various embodiments, an upper portion of the first metal electrode pattern and an upper portion of the second metal electrode pattern may have equal widths.

According to various embodiments, the first upper work-function electrode pattern and the second upper work-function electrode pattern may have different thicknesses.

In various embodiments, a number of layers included in the first upper work-function electrode pattern may be greater than a number of layers included in the second upper work-function electrode pattern.

According to various embodiments, uppermost surfaces of the first upper work-function electrode pattern and uppermost surfaces of the second upper work-function electrode pattern may be at equal heights.

According to various embodiments, the uppermost surfaces of the first lower work-function electrode pattern and the uppermost surfaces of the first upper work-function electrode pattern may be at equal heights.

BRIEF DESCRIPTION OF THE DRAWINGS

The inventive concept will become more apparent in view of the attached drawings and accompanying detailed description.

FIGS. 7A to 22A are cross-sectional views taken along the lines I-I', II-II', III-III', and IV-IV' of FIG. 1 to illustrate a method of fabricating a semiconductor device according to some embodiments of the inventive concept;

FIGS. 7B to 22B are cross-sectional views taken along the lines V-V', VI-VI', VII-VII', and VIII-VIII' of FIG. 1 to illustrate a method of fabricating a semiconductor device according to some embodiments of the inventive concept;

DETAILED DESCRIPTION OF THE EMBODIMENTS

Figure 1:
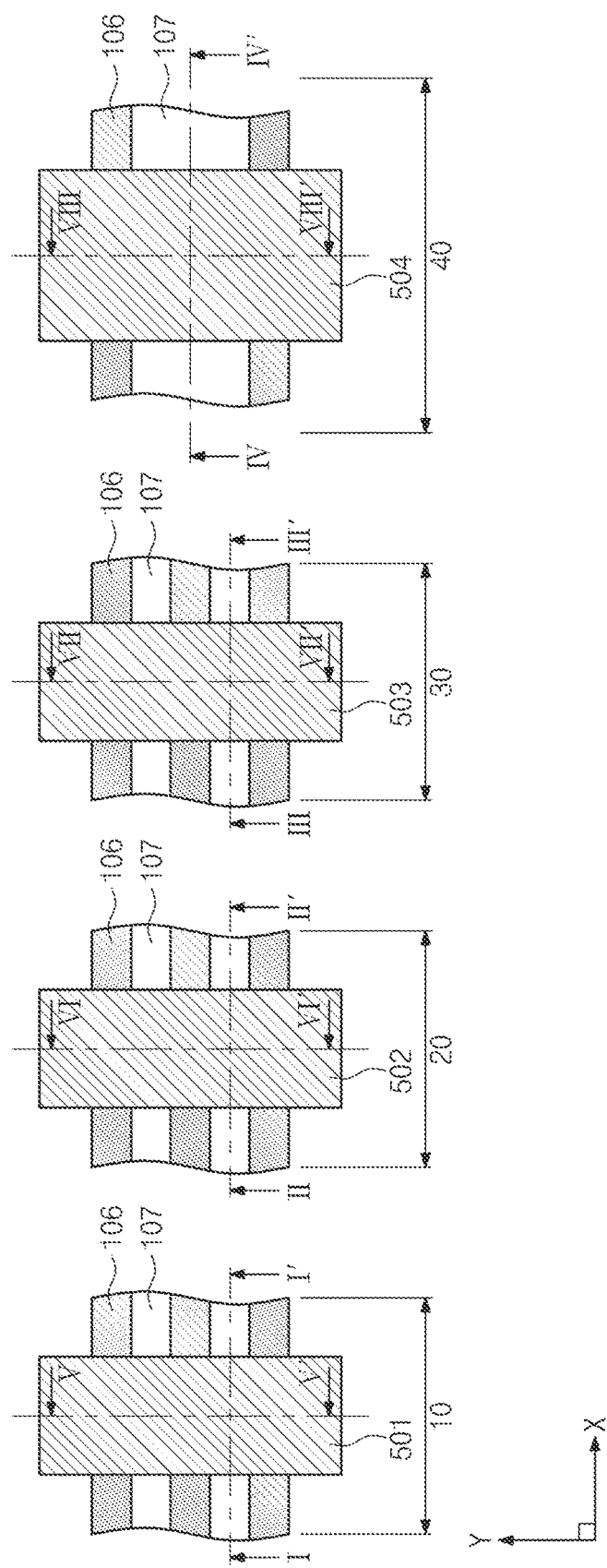
FIG. 1 is a plan view illustrating a semiconductor device according to example embodiments of the inventive concept.

The inventive concept will now be described more fully hereinafter with reference to the accompanying drawings, in which example embodiments of the inventive concept are shown. The advantages and features of the inventive concept and methods of achieving them will be apparent from the following example embodiments that will be described in more detail with reference to the accompanying drawings. It should be noted, however, that the inventive concept is not limited to the following example embodiments, and may be implemented in various forms. These example embodiments are provided so that this disclosure will be thorough and complete and will convey the scope of the disclosure to those skilled in the art. In the drawings, embodiments of the inventive concept are not limited to the specific examples provided herein and are exaggerated for clarity.

The terminology used herein is for the purpose of describing particular embodiments only and is not intended to limit the inventive concept. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, steps, operations, elements, and/or components, but do not preclude the presence or addition of one or more other features, steps, operations, elements, components, and/or groups thereof.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present inventive concept. Example embodiments of aspects of the present inventive concept explained and illustrated herein include their complementary counterparts. The same reference numerals or the same reference designators denote the same elements throughout the specification.

Moreover, example embodiments are described herein with reference to cross-sectional illustrations and/or plane illustrations that are idealized illustrations. Accordingly, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Figure 2A:
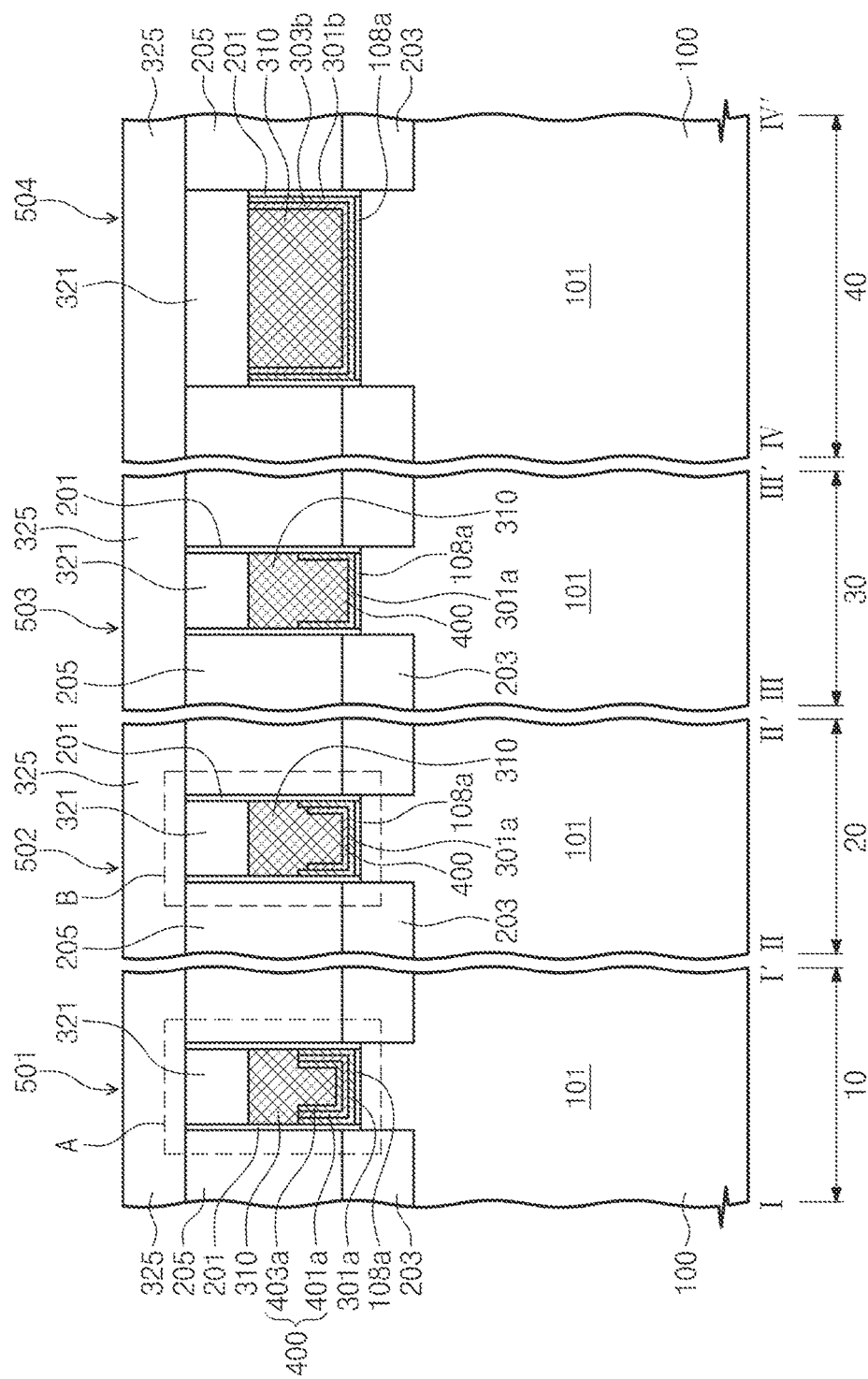
FIG. 2A is a cross-sectional view taken along the lines I-I', II-II', III-III', and IV-IV' of FIG. 1 to illustrate a semiconductor device according to some embodiments of the inventive concept.
Figure 2B:
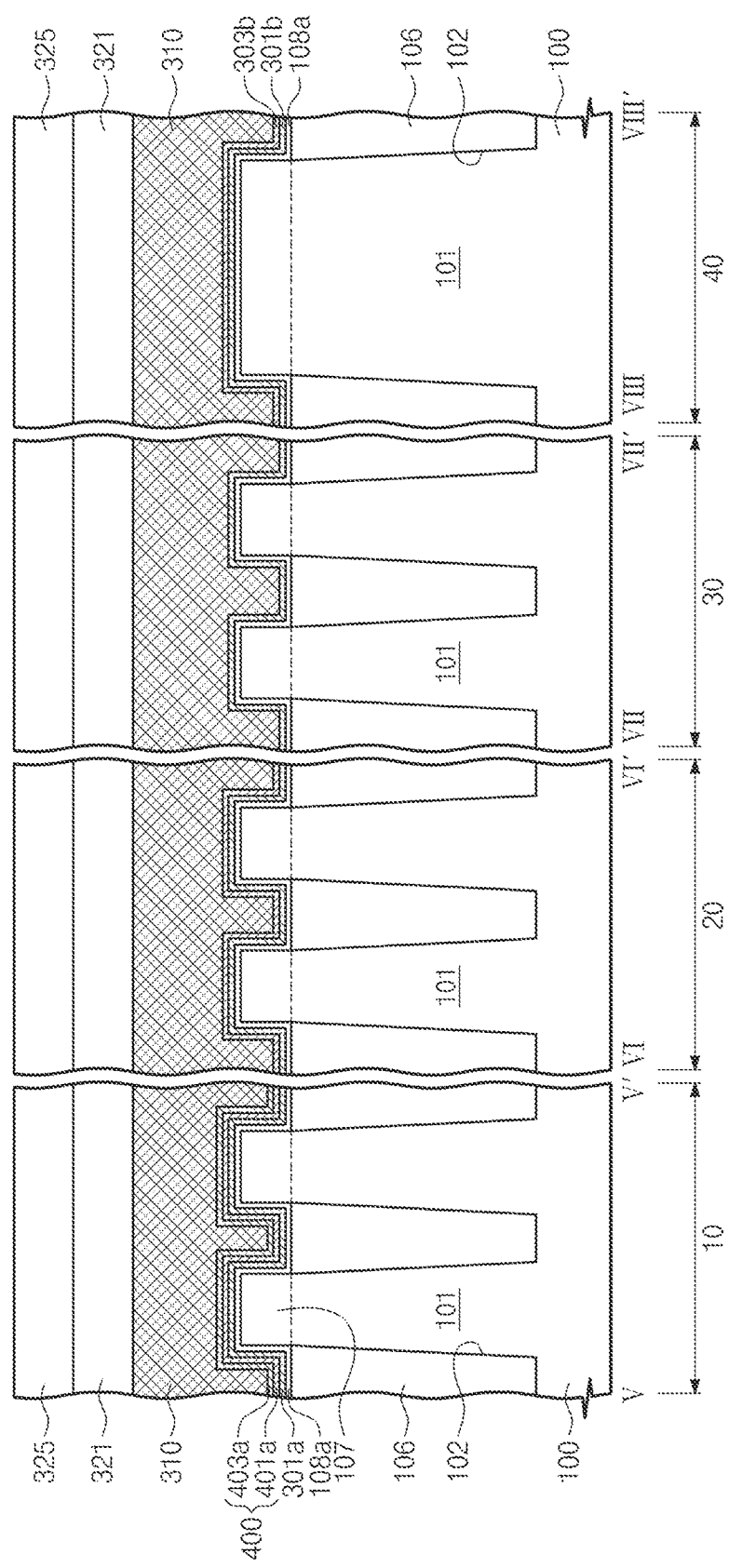
FIG. 2B is a cross-sectional view taken along lines V-V', VI-VI', VII-VII', and VIII-VIII' of FIG. 1 to illustrate a semiconductor device according to some embodiments of the inventive concept.
Figure 2C:
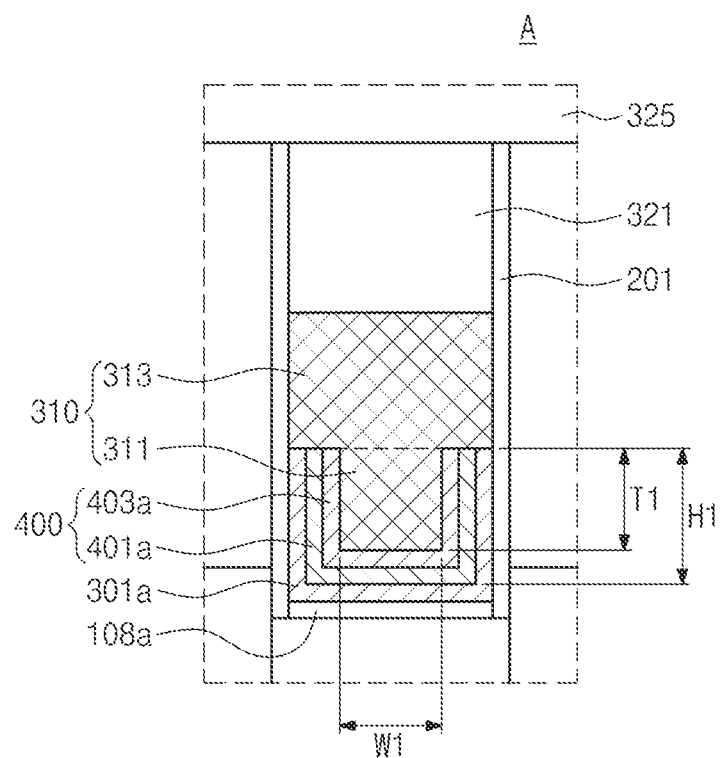
FIG. 2C is an enlarged view of the portion 'A' of FIG. 2A.
Figure 2D:
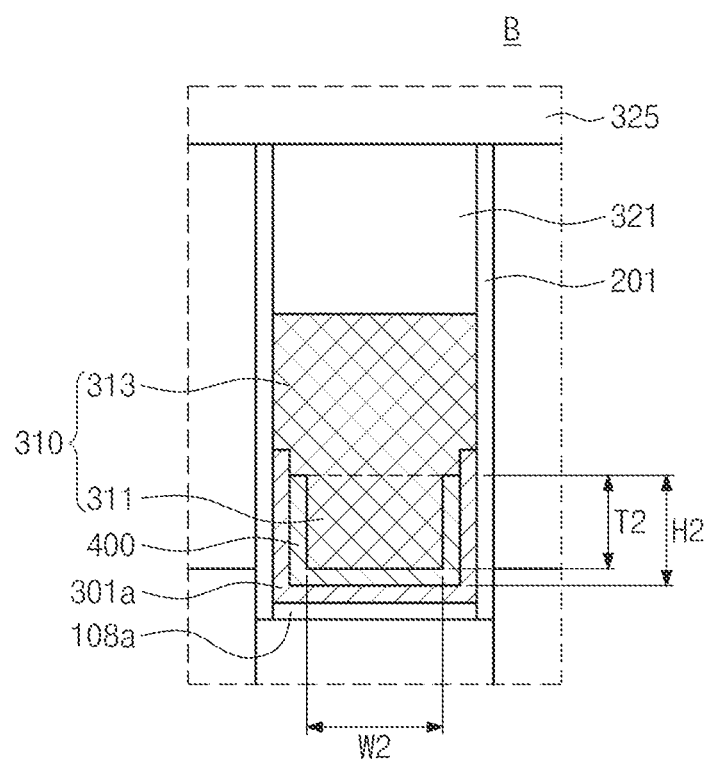
FIG. 2D is an enlarged view of the portion 'B' of FIG. 2A.

FIG. 1 is a plan view illustrating a semiconductor device according to example embodiments of the inventive concept. FIG. 2A is a cross-sectional view taken along the lines I-I', II-II', III-III', and IV-IV' of FIG. 1 to illustrate a semiconductor device according to some embodiments of the inventive concept. FIG. 2B is a cross-sectional view taken along the lines V-V', VI-VI', VII-VII', and VIII-VIII' of FIG. 1 to illustrate a semiconductor device according to some embodiments of the inventive concept. FIG. 2C is an enlarged view of the portion 'A' of FIG. 2A, and FIG. 2D is an enlarged view of the portion 'B' of FIG. 2A.

Referring to FIGS. 1, 2A, and 2B, a substrate 100 may include a first region 10, a second region 20, a third region 30, and a fourth region 40. The substrate 100 may include a device isolation layer 106 defining active regions 101. The active regions 101 may include fins 107 protruding from a top surface of the substrate 100. The fins 107 may extend in a first direction X and may be arranged in a second direction Y perpendicular to the first direction X.

A first gate electrode 501, a second gate electrode 502, a third gate electrode 503, and a fourth gate electrode 504 may be disposed on the first region 10, the second region 20, the third region 30, and the fourth region 40 of the substrate 100, respectively. Each of the first to fourth gate electrodes 501, 502, 503, and 504 may cross over one or more fins 107 of each of the first to fourth regions 10, 20, 30, and 40. The first to fourth gate electrodes 501, 502, 503, and 504 may extend in the second direction Y and may be arranged in the first direction X.

The first gate electrode 501 may include a gate insulating pattern 108a, a lower work-function electrode pattern 301a, an upper work-function electrode pattern 400, and a metal electrode pattern 310 which are sequentially stacked on the substrate 100. The lower work-function electrode pattern 301a may be disposed on a top surface of the gate insulating pattern 108a, and a top surface of the lower work-function electrode pattern 301a may be recessed. The upper work-function electrode pattern 400 may conformally cover a bottom surface and inner sidewalls of the recess region of the lower work-function electrode pattern 301a. A topmost surface of the lower work-function electrode pattern 301a may be disposed at the same level as a topmost surface of the upper work-function electrode pattern 400. The upper work-function electrode pattern 400 may include a first upper work-function electrode pattern 401a and a second upper work-function electrode pattern 403a.

The second gate electrode 502 may include a gate insulating pattern 108a, a lower work-function electrode pattern 301a, an upper work-function electrode pattern 400, and a metal electrode pattern 310 which are sequentially stacked on the substrate 100. The lower work-function electrode pattern 301a may be disposed on a top surface of the gate insulating pattern 108a, and a top surface of the lower work-function electrode pattern 301a may be recessed. The upper work-function electrode pattern 400 may conformally cover a bottom surface and inner sidewalls of the recess region of the lower work-function electrode pattern 301a. A topmost surface of the lower work-function electrode pattern 301a of the second gate electrode 502 may be higher than a topmost surface of the upper work-function electrode pattern 400 of the second gate electrode 502. The upper work-function electrode pattern 400 of the second gate electrode 502 may be formed of the same material as the second upper work-function electrode pattern 403a of the first gate electrode 501. The upper work-function electrode patterns 400 of the first and second gate electrodes 501 and 502 may have different thicknesses from each other. In some embodiments, the upper work-function electrode pattern 400 of the first gate electrode 501 may be thicker than the upper work-function electrode pattern 400 of the second gate electrode 502.

Referring to FIGS. 2C and 2D, the upper work-function electrode pattern 400 of each of the first and second gate electrodes 501 and 502 may include a recess region having a bottom surface and opposing inner sidewalls. A bottom surface of the upper work-function electrode 7 pattern 400 of the first gate electrode 501 may be disposed at the same level as a bottom surface of the upper work-function electrode pattern 400 of the second gate electrode 502. In some embodiments, a width W1 between the inner sidewalls of the upper work-function electrode pattern 400 of the first gate electrode 501 may be smaller than a width W2 between the inner sidewalls of the upper work-function electrode pattern 400 of the second gate electrode 502, and a height H1 between the topmost surface and the bottom surface of the upper work-function electrode pattern 400 of the first gate electrode 501 may be greater than a height H2 between the topmost surface and the bottom surface of the upper work-function electrode pattern 400 of the second gate electrode 502.

In each of the first and second gate electrodes 501 and 502, the metal electrode pattern 310 may be disposed on the upper work-function electrode pattern 400 and may include a first metal electrode pattern 311 and a second metal electrode pattern 313. The first metal electrode pattern 311 may be in contact with the bottom surface and the inner sidewalls of the recess region of the upper work-function electrode pattern 400. The second metal electrode pattern 313 may be disposed on the first metal electrode pattern 311 and may be in contact with the topmost surface of the lower work-function electrode pattern 301a and the topmost surface of the upper work-function electrode pattern 400.

The first metal electrode pattern 311 may be a lower portion of the metal electrode pattern 310 which may be lower than the topmost surface of the upper work-function electrode pattern 400. In other words, the first metal electrode pattern 311 may be a portion of the metal electrode pattern 310 which in the recess region of the upper work-function electrode pattern 400 and, in some embodiments, which fills the recess region of the upper work-function electrode pattern 400. The second metal electrode pattern 313 may be an upper portion of the metal electrode pattern 310 which may be higher than the topmost surface of the upper work-function electrode pattern 400.

A top surface of the first metal electrode pattern 311 of the first gate electrode 501 may be disposed at the same level as the topmost surface of the lower work-function electrode pattern 301a of the first gate electrode 501. A top surface of the first metal electrode pattern 311 of the second gate electrode 502 may be lower than the topmost surface of the lower work-function electrode pattern 301a of the second gate electrode 502.

A width of the first metal electrode pattern 311 of the first gate electrode 501 may be equal to the width W1 between the inner sidewalls of the upper work-function electrode pattern 400 of the first gate electrode 501. A width of the first metal electrode pattern 311 of the second gate electrode 502 may be equal to the width W2 between the inner sidewalls of the upper work-function electrode pattern 400 of the second gate electrode 502. A thickness T1 of the first metal electrode pattern 311 of the first gate electrode 501 may be greater than a thickness T2 of the first metal electrode pattern 311 of the second gate electrode 502. A cross-sectional area of the first metal electrode pattern 311 may be calculated by multiplying its width by its thickness. The cross-sectional area of the first metal electrode pattern 311 of the first gate electrode 501 may be equal to the cross-sectional area of the first metal electrode pattern 311 of the second gate electrode 502 (i.e., T1×W1=T2×W2). Referring again to FIGS. 1, 2A, and 2B, the third gate electrode 503 may include a gate insulating pattern 108a, a lower work-function electrode pattern 301a, and a metal electrode pattern 310 which are sequentially stacked on the substrate 100. The third gate electrode 503 may not include the upper work-function electrode pattern 400. Thus, in the third gate electrode 503, the metal electrode pattern 310 may be in direct contact with the lower work-function electrode pattern 301a.

Topmost surfaces of the lower work-function electrode patterns 301a of the first, second and third gate electrodes 501, 502, and 503 may be disposed at the same level.

A width of the fourth gate electrode 504 may be greater than those of the first to third gate electrodes 501, 502, and 503. The fourth gate electrode 504 may include a first work-function electrode pattern 301b, a second work-function electrode pattern 303b, and a metal electrode pattern 310. The first work-function electrode pattern 301b may be disposed on the top surface of the substrate 100, and a top surface of the first work-function electrode pattern 301b may be recessed. The second work-function electrode pattern 303b may conformally cover a bottom surface and inner sidewalls of the recess region of the first work-function electrode pattern 301b. A gate insulating pattern 108a may be disposed between the first work-function electrode pattern 301b and the substrate 100. A topmost surface of the first work-function electrode pattern 301b, a topmost surface of the second work-function electrode pattern 303b, and a top surface of the metal electrode pattern 310 may be disposed at the same level in the fourth gate electrode 504. The topmost surface of the first work-function electrode pattern 301b may be higher than the topmost surfaces of the lower work-function electrode pattern 301a and the first and second upper work-function electrode patterns 401a and 403a. Top surfaces of the first to fourth gate electrodes 501, 502, 503, and 504 may be disposed at the same level. Insulating patterns 321 may be disposed on the first to fourth gate electrodes 501, 502, 503, and 504, respectively. The insulating patterns 321 may include, for example, an oxide (e.g., silicon oxide).

In some embodiments, the lower work-function electrode pattern 301a and the first work-function electrode pattern 301b may include at least one of a metal (e.g., tantalum (Ta), titanium (Ti), aluminum (Al), hafnium (Hf), tungsten (W), or molybdenum (Mo)), a nitride including the metal, a carbide including the metal, a silicon-nitride including the metal, or a silicide including the metal. In some embodiments, the lower work-function electrode pattern 301a and the first work-function electrode pattern 301b may include at least one of hafnium oxide ($HfO_2$), hafnium-silicon oxide (HfSiO), hafnium-silicon oxynitride (HfSiON), hafnium oxynitride (HfON), hafnium-aluminum oxide (HfAlO), hafnium-lanthanum oxide (HfLaO), zirconium oxide ($ZrO_2$), tantalum oxide ($TaO_2$), zirconium-silicon oxide (ZrSiO), or lanthanum oxide ($La_2O_3$).

The upper work-function electrode pattern 400 and the second work-function electrode pattern 303b may include a different material from the lower work-function electrode pattern 301a and the first work-function electrode pattern 301b. In some embodiments, the upper work-function electrode pattern 400 and the second work-function electrode pattern 303b may include at least one of a metal (e.g., tantalum (Ta), titanium (Ti), aluminum (Al), hafnium (Hf), tungsten (W), or molybdenum (Mo)), a nitride including the metal, a carbide including the metal, a silicon-nitride including the metal, or a silicide including the metal. In some embodiments, the upper work-function electrode pattern 400 and the second work-function electrode pattern 303b may include at least one of hafnium oxide ($HfO_2$), hafnium-silicon oxide (HfSiO), hafnium-silicon oxynitride (HfSiON), hafnium oxynitride (HfON), hafnium-aluminum oxide (HfAlO), hafnium-lanthanum oxide (HfLaO), zirconium oxide ($ZrO_2$), tantalum oxide ($TaO_2$), zirconium-silicon oxide (ZrSiO), or lanthanum oxide ($La_2O_3$).

Spacers 201 may be formed to cover both outer sidewalls of each of the first to fourth gate electrodes 501, 502, 503, and 504. The metal electrode pattern 310 may include a metal material (e.g., tungsten (W)).

Source/drain regions 203 may be disposed at both sides of each of the first to fourth gate electrodes 501, 502, 503, and 504. The source/drain regions 203 may be disposed in the active region 101 of the substrate 100. In some embodiments, the source/drain regions 203 may have top surfaces higher than top surfaces of the fins 107. Thus, the top surfaces of the source/drain regions 203 may protrude from the top surfaces of the fins 107. In some embodiments, if a transistor including the source/drain regions 203 is an N-type metal-oxide-semiconductor (NMOS) transistor, the source/drain regions 203 may include silicon carbide (SiC). In some embodiments, if the transistor including the source/drain regions 203 is a P-type MOS (PMOS) transistor, the source/drain regions 203 may include silicon-germanium (SiGe).

A lower interlayer insulating layer 205 may be disposed on the substrate 100. The lower interlayer insulating layer 205 may cover the source/drain regions 203 and may fill spaces between the first to fourth gate electrodes 501, 502, 503, and 504. The lower interlayer insulating layer 205 may expose top surfaces of the insulating patterns 321.

An upper interlayer insulating layer 325 may be disposed on the lower interlayer insulating layer 205.

All of transistors respectively including the first to fourth gate electrodes 501, 502, 503, and 504 may be NMOS transistors, or PMOS transistors. In some embodiments, at least one of the transistors may be an NMOS transistor, or at least one of the transistors may be a PMOS transistor.

Figure 3:
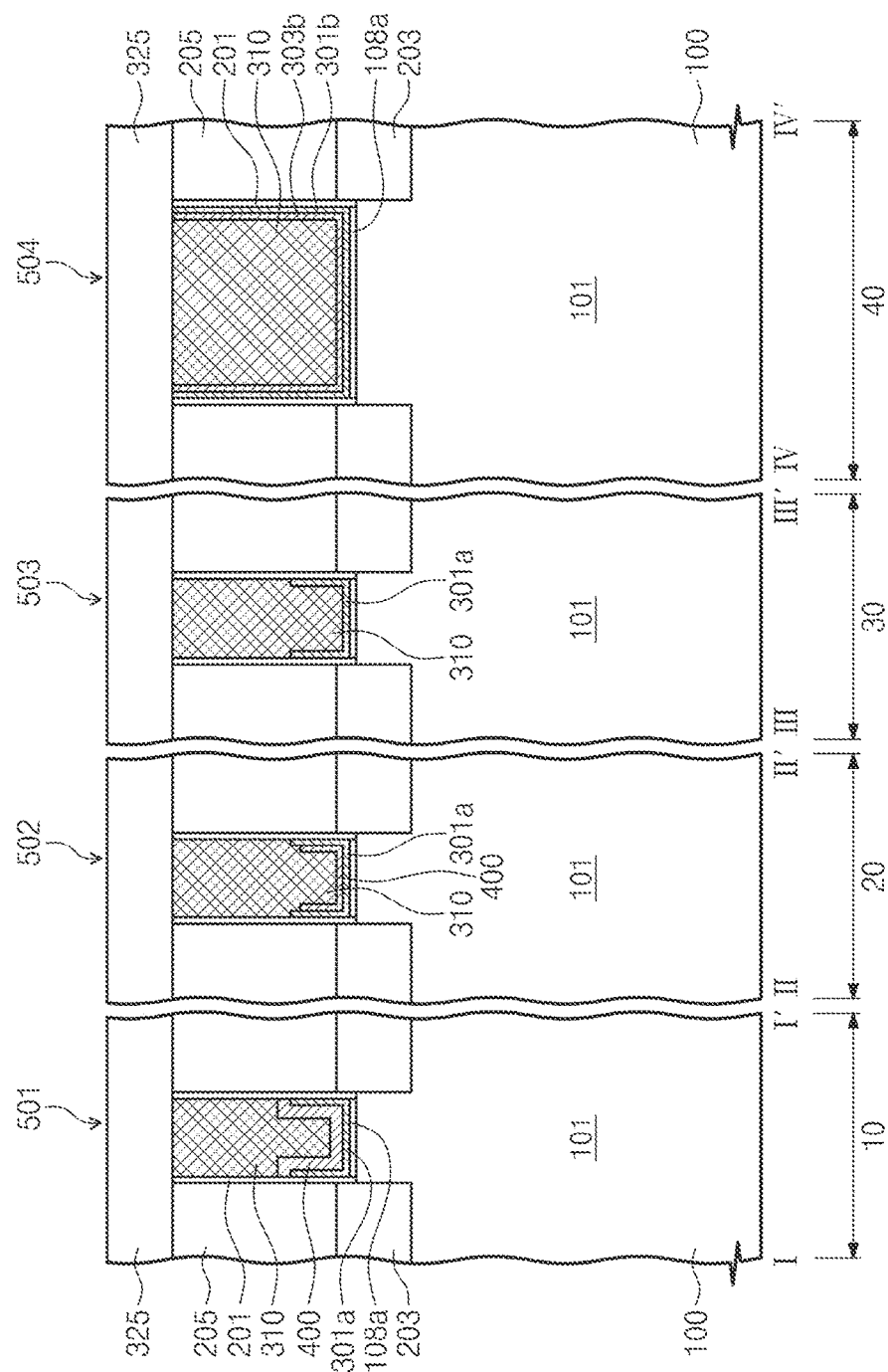
FIG. 3 is a cross-sectional view taken along the lines I-I', II-II', III-III', and IV-IV' of FIG. 1 to illustrate a semiconductor device according to some embodiments of the inventive concept.

FIG. 3 is a cross-sectional view taken along the lines I-I', II-II', III-III', and IV-IV' of FIG. 1 to illustrate a semiconductor device according to some embodiments of the inventive concept.

Referring to FIG. 3, an upper work-function electrode pattern 400 of the first gate electrode 501 may conformally cover the bottom surface and the inner sidewalls of the recess region of the lower work-function electrode pattern 301a of the first gate electrode 501 and may extend onto the topmost surface of the lower work-function electrode pattern 301a of the first gate electrode 501. In the first gate electrode

501, a topmost surface of the upper work-function electrode pattern 400 may be higher than the topmost surface of the lower work-function electrode pattern 301*a*.

The upper work-function electrode pattern 400 of the second gate electrode 502 may conformally cover the bottom surface and the inner sidewalls of the recess region of the lower work-function electrode pattern 301*a* of the second gate electrode 502. In the second gate electrode 502, the topmost surface of the upper work-function electrode pattern 400 may be lower than the topmost surface of the lower work-function electrode pattern 301*a*. The upper work-function electrode pattern 400 of the first gate electrode 501 may be thicker than the upper work-function electrode pattern 400 of the second gate electrode 502 as illustrated in FIG. 3.

A metal electrode pattern 31Q may be disposed on the upper work-function electrode pattern 400 of each of the first and second gate electrodes 501 and 502. The insulating patterns 321 may be omitted as illustrated in FIG. 3. Top surfaces of the metal electrode patterns 310 may be coplanar with the lower interlayer insulating layer 205 and may be in direct contact with the upper interlayer insulating layer 325.

Figure 4:
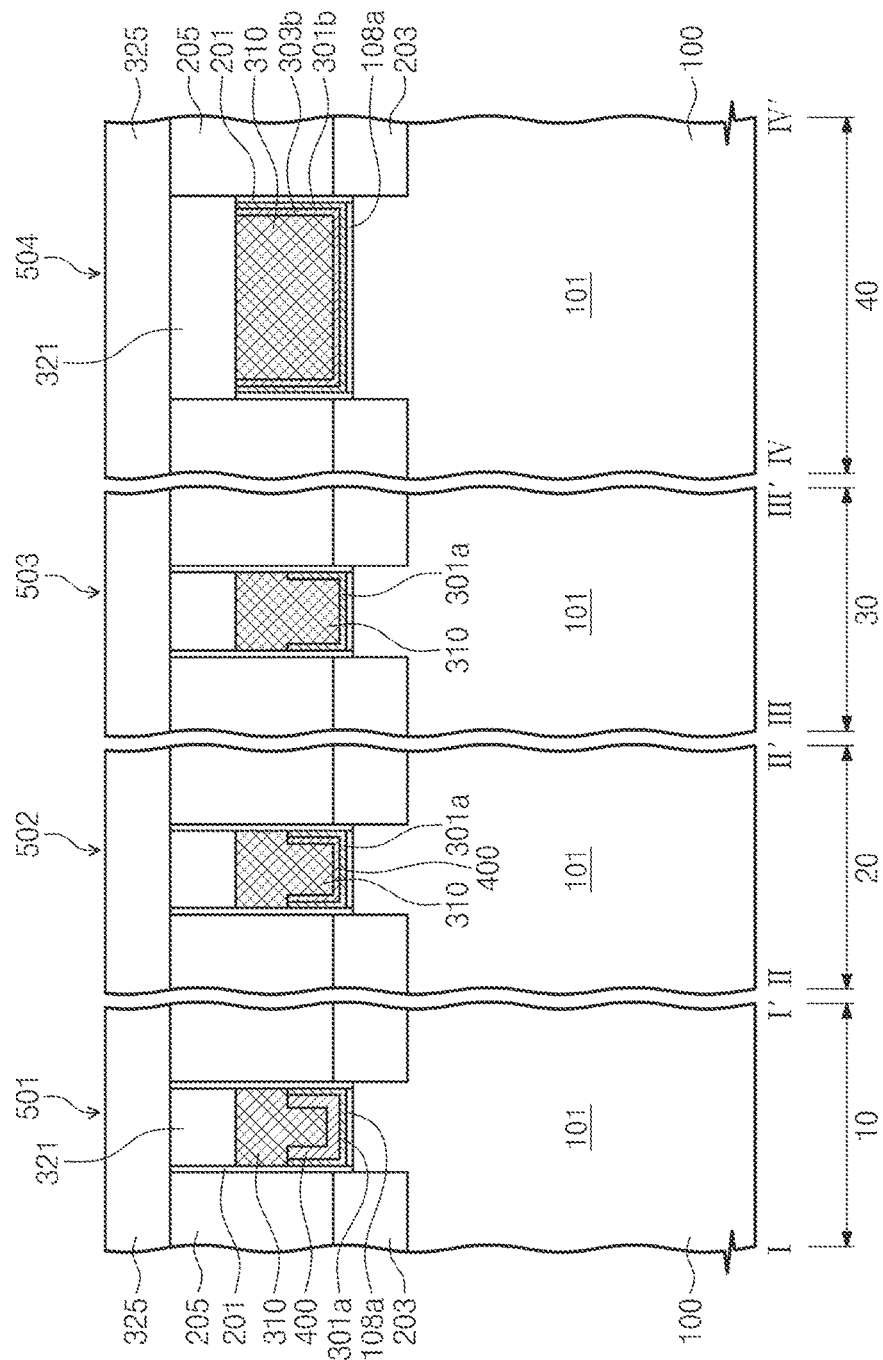
FIG. 4 is a cross-sectional view taken along the lines I-I', II-II', III-III', and IV-IV' of FIG. 1 to illustrate a semiconductor device according to some embodiments of the inventive concept.

FIG. 4 is a cross-sectional view taken along the lines I-I', II-II', III-III', and IV-IV' of FIG. 1 to illustrate a semiconductor device according to some embodiments of the inventive concept.

Referring to FIG. 4, upper work-function electrode patterns 400 of the first and second gate electrodes 501 and 502 may conformally cover the bottom surfaces and the inner sidewalls of the recess regions of the lower work-function electrode patterns 301*a* of the first and second gate electrodes 501 and 502. In each of the first and second gate electrodes 501 and 502, the topmost surface of the upper work-function electrode pattern 400 may be disposed at the same level as the topmost surface of the lower work-function electrode pattern 301*a*. The upper work-function electrode patterns 400 of the first and second gate electrodes 501 and 502 may have different thicknesses. In some embodiments, the upper work-function electrode pattern 400 of the first gate electrode 501 may be thicker than the upper work-function electrode pattern 400 of the second gate electrode 502 as illustrated in FIG. 4.

Figure 5:
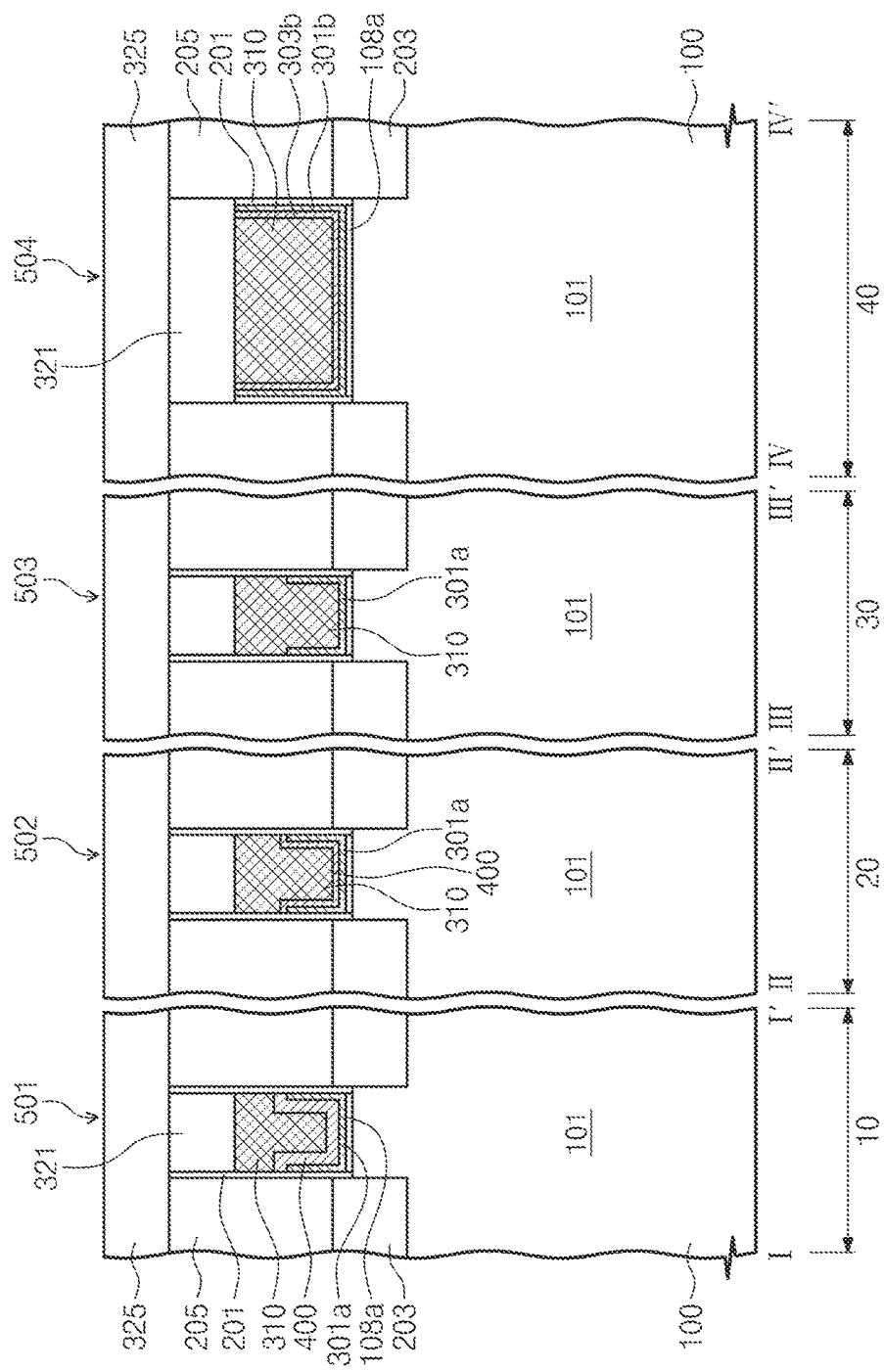
FIG. 5 is a cross-sectional view taken along the lines I-I', II-II', III-III', and IV-IV' of FIG. 1 to illustrate a semiconductor device according to some embodiments of the inventive concept.

FIG. 5 is a cross-sectional view taken along the lines I-I', II-II', III-III', and IV-IV' of FIG. 1 to illustrate a semiconductor device according to some embodiments of the inventive concept.

Referring to FIG. 5, upper work-function electrode patterns 400 of the first and second gate electrodes 501 and 502 may conformally cover the bottom surfaces and the inner sidewalls of the recess regions of the lower work-function electrode patterns 301*a* of the first and second gate electrodes 501 and 502. In each of the first and second gate electrodes 501 and 502, a topmost surface of the upper work-function electrode pattern 400 may extend onto the topmost surface of the lower work-function electrode pattern 301*a*. Thus, the topmost surface of the upper work-function electrode pattern 400 may be higher than the topmost surface of the lower work-function electrode pattern 301*a* in each of the first and second gate electrodes 501 and 502.

The upper work-function electrode patterns 400 of the first and second gate electrodes 501 and 502 may have different thicknesses. In some embodiments, the upper work-function electrode pattern 400 of the first gate electrode 501 may be thicker than the upper work-function electrode pattern 400 of the second gate electrode 502 as illustrated in FIG. 5.

Figure 6:
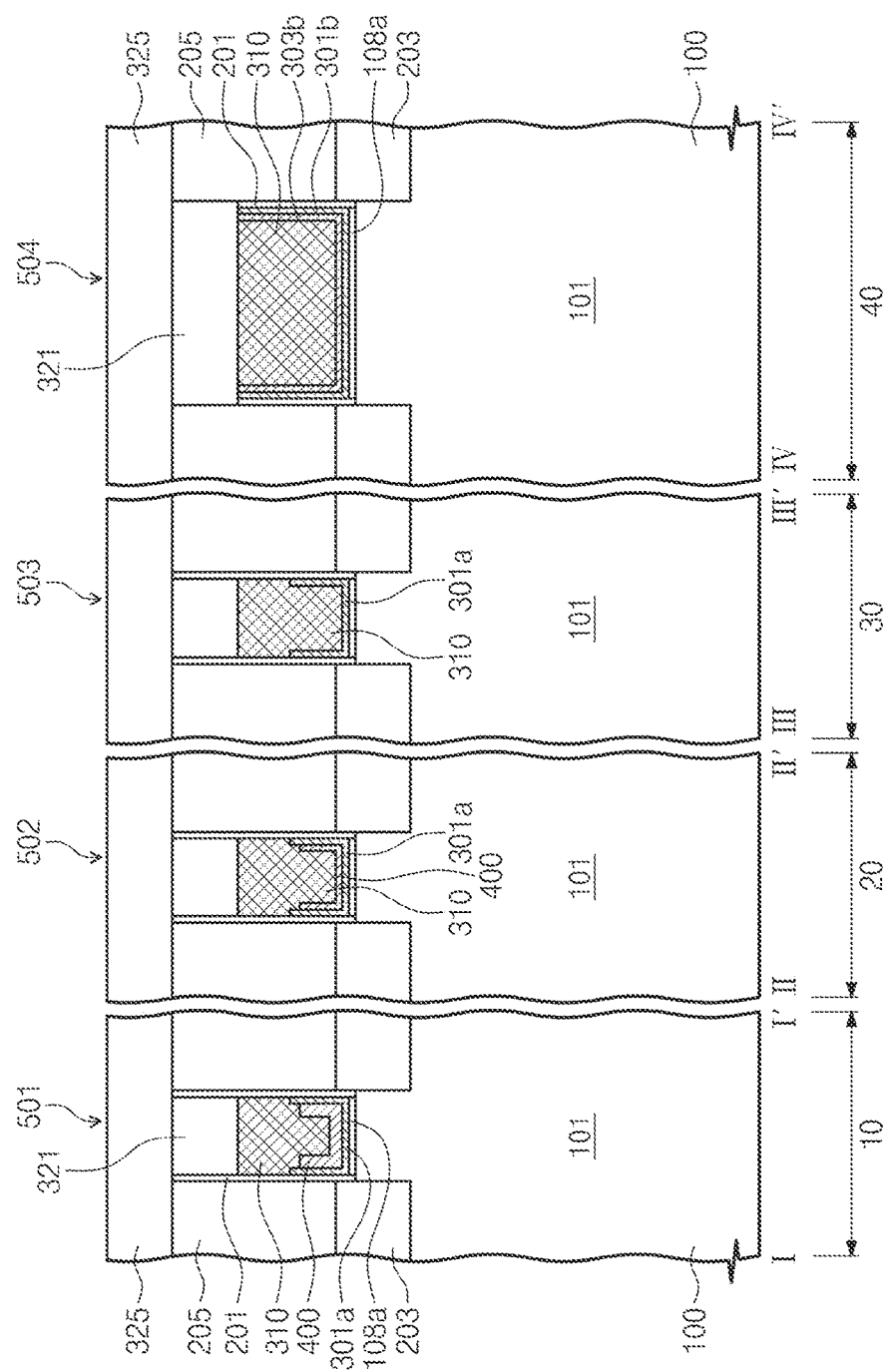
FIG. 6 is a cross-sectional view taken along the lines I-I', II-II', III-III', and IV-IV' of FIG. 1 to illustrate a semiconductor device according to some embodiments of the inventive concept.

FIG. 6 is a cross-sectional view taken along the lines I-I', II-II', III-III', and IV-IV' of FIG. 1 to illustrate a semiconductor device according to some embodiments of the inventive concept.

Referring to FIG. 6, upper work-function electrode patterns of the first and second gate electrodes 501 and 502 may conformally cover the bottom surfaces and the inner sidewalls of the recess regions of the lower work-function electrode patterns 301*a* of the first and second gate electrodes 501 and 502. In each of the first and second gate electrodes 501 and 502, a topmost surface of the upper work-function electrode pattern 400 may be lower than the topmost surface of the lower work-function electrode pattern 301*a*.

The upper work-function electrode patterns 400 of the first and second gate electrodes 501 and 502 may have different thicknesses from each other. In some embodiments, the upper work-function electrode pattern 400 of the first gate electrode 501 may be thicker than the upper work-function electrode pattern 400 of the second gate electrode 502 as illustrated in FIG. 6.

FIGS. 7A to 22A are cross-sectional views taken along the lines I-I', II-II', III-III', and IV-IV' of FIG. 1 to illustrate a method of fabricating a semiconductor device according to some embodiments of the inventive concept. FIGS. 7B to 22B are cross-sectional views taken along the lines V-V', VI-VI', VII-VII', and VIII-VIII' of FIG. 1 to illustrate a method of fabricating a semiconductor device according to some embodiments of the inventive concept.

Figure 7A:
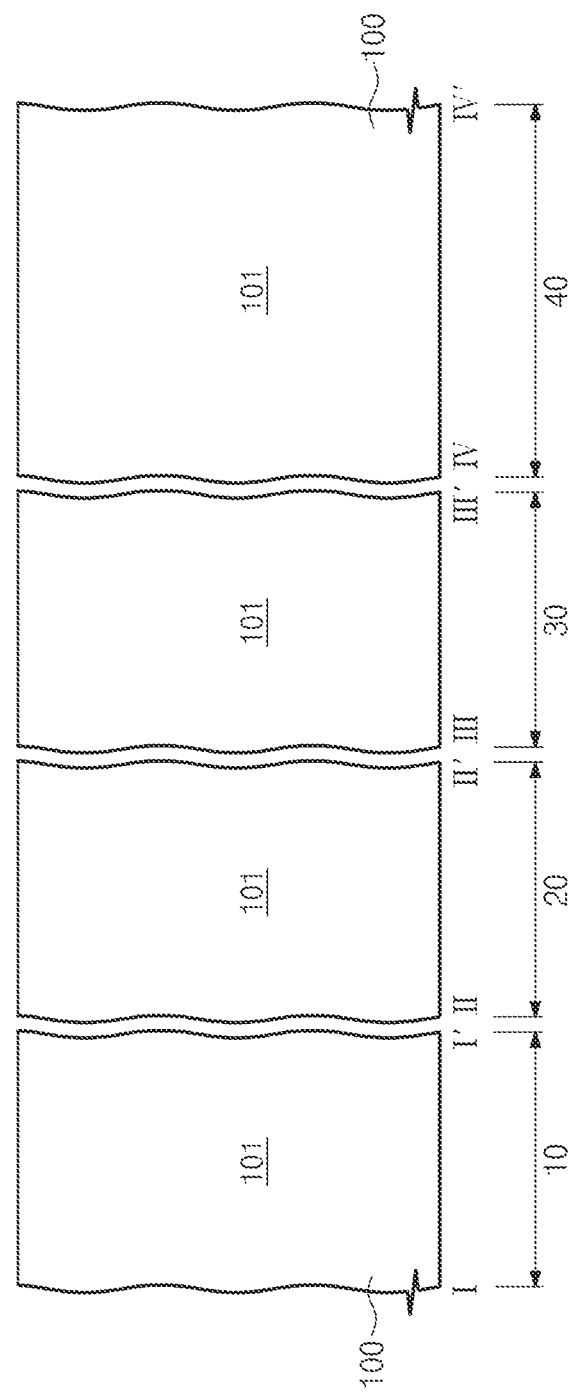
Figure 7B:
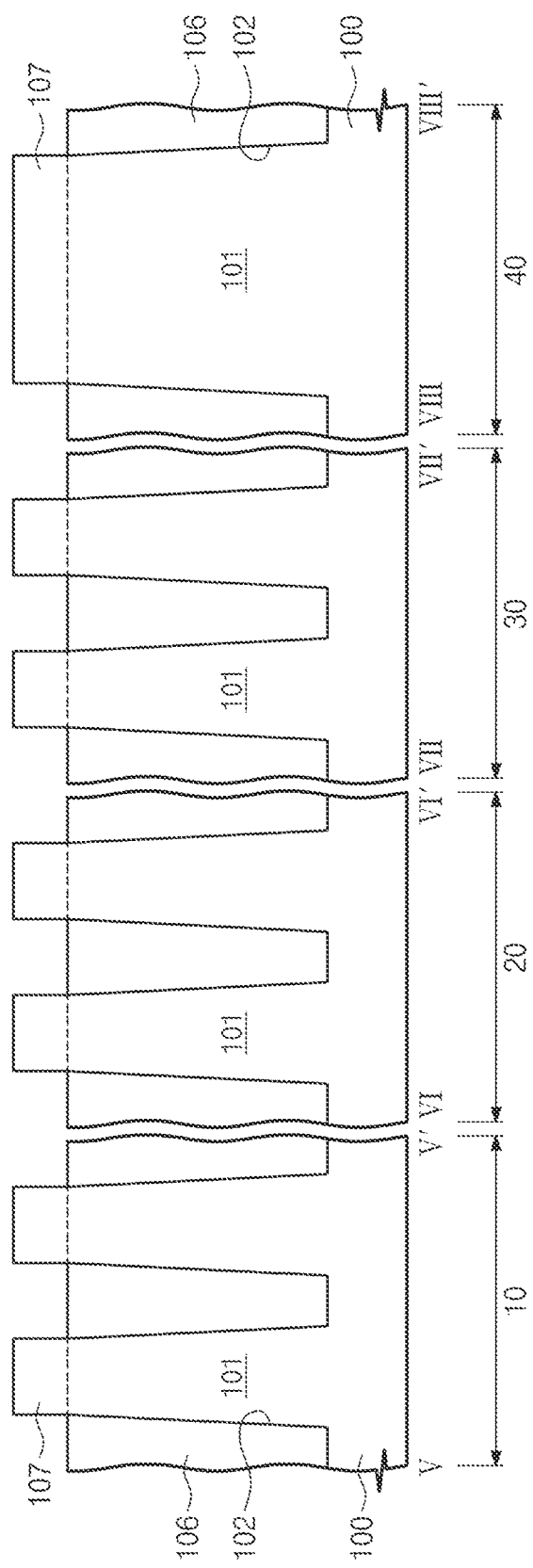

Referring to FIGS. 1, 7A, and 7B, a substrate 100 including first to fourth regions 10, 20, 30, and 40 may be patterned to form trenches 102. In more detail, a first mask pattern may be formed on the substrate 100, and the substrate 100 exposed by the first mask pattern may be anisotropically etched using the first mask pattern as an etch mask. The first mask pattern may include a material having an etch selectivity with respect to the substrate 100. The trenches 102 may define active regions 101. The substrate 100 may be, for example, a bulk silicon substrate or a silicon-on-insulator (SOI) substrate.

The trenches 102 may be filled with an oxide to form a device isolation layer 106. In more detail, an oxide may be formed on the substrate 100 to fill the trenches 102, and the oxide may be planarized until the first mask pattern is exposed, thereby forming the device isolation layer 106. The active regions 101 may extend in the first direction X and may be arranged in the second direction Y perpendicular to the first direction X. The first mask pattern may be removed after the formation of the device isolation layer 106.

Upper portions of the active regions 101 may be exposed to form fins 107. In more detail, a top surface of the device isolation layer 106 may be recessed by an etching process, so the upper portions of the active regions 101 may be exposed from the device isolation layer 106. The exposed upper portions of the active regions 101 may correspond to the fins 107 protruding from the device isolation layer 106. Each of the fins 107 may be disposed between portions, adjacent to each other, of the device isolation layer 106. The fins 107 may extend in the first direction X and may be arranged in the second direction Y.

Figure 8A:
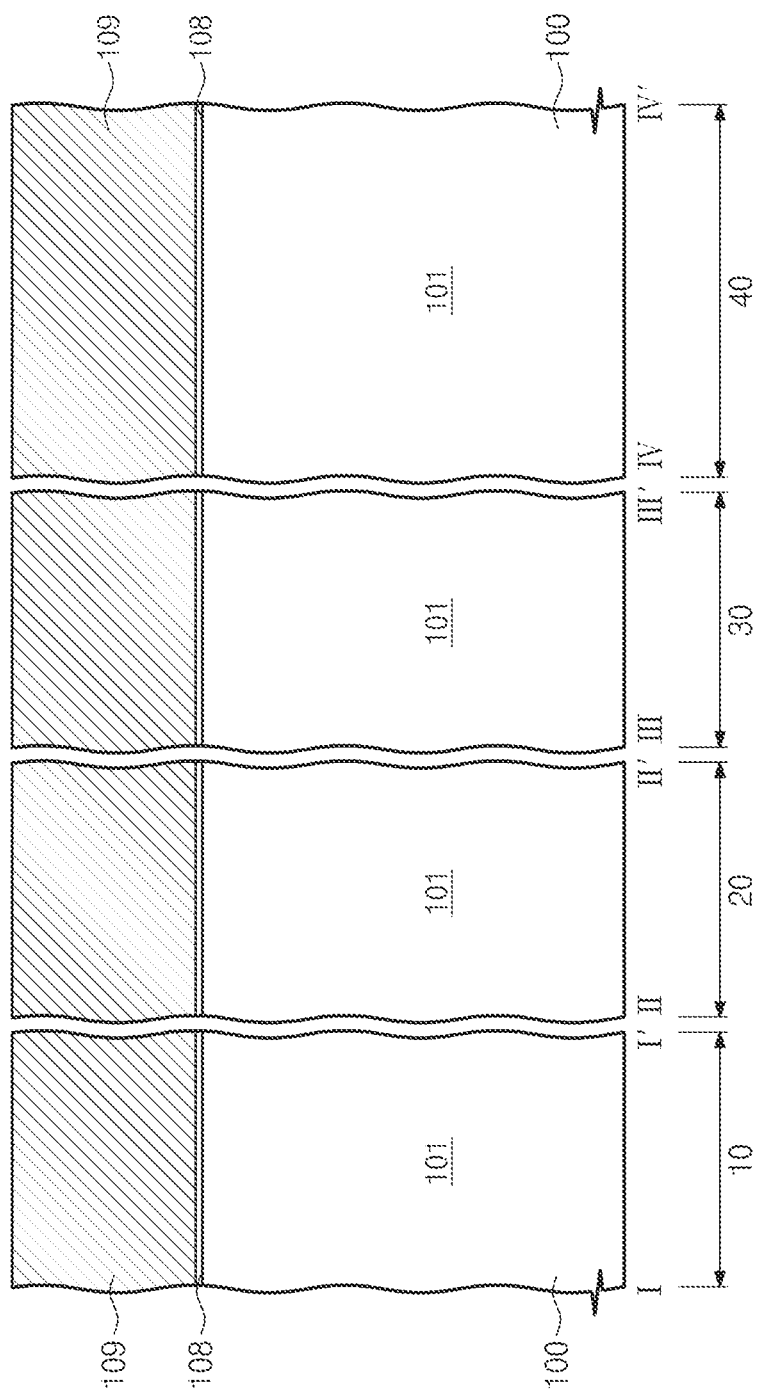
Figure 8B:
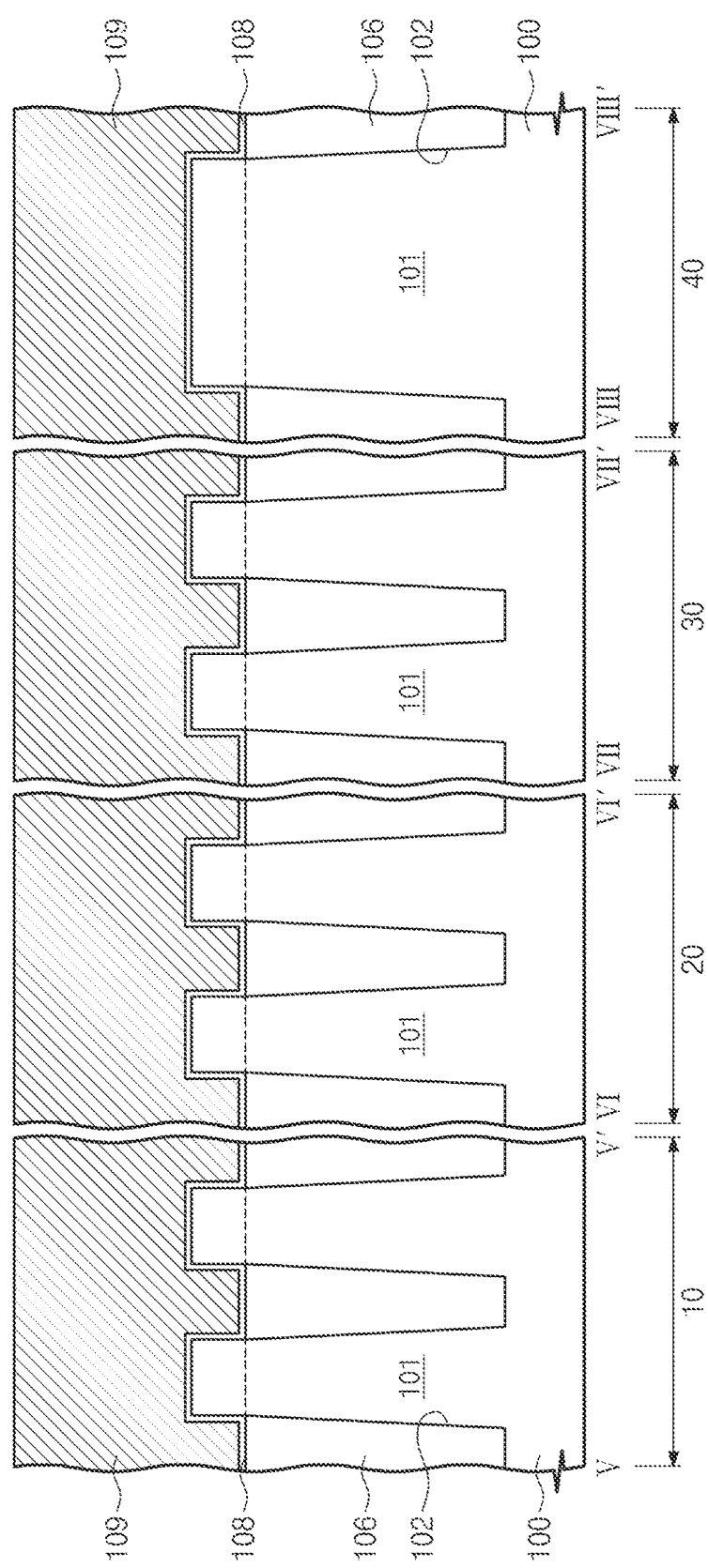

Referring to FIGS. 8A and 8B, a gate insulating layer 108 and a gate sacrificial layer 109 may be sequentially formed on the substrate 100. The gate insulating layer 108 may be conformally formed on the fins 107 and the top surface of the substrate 100. The gate insulating layer 108 may include at least one of high-k dielectric layers. For example, the gate insulating layer 108 may include at least one of a hafnium oxide layer, a hafnium silicate layer, a zirconium oxide layer, or a zirconium silicate layer.

The gate sacrificial layer 109 may include at least one of layers having an etch selectivity with respect to the gate insulating layer 108. For example, the gate sacrificial layer 109 may be formed of a poly-silicon layer.

Figure 9B:
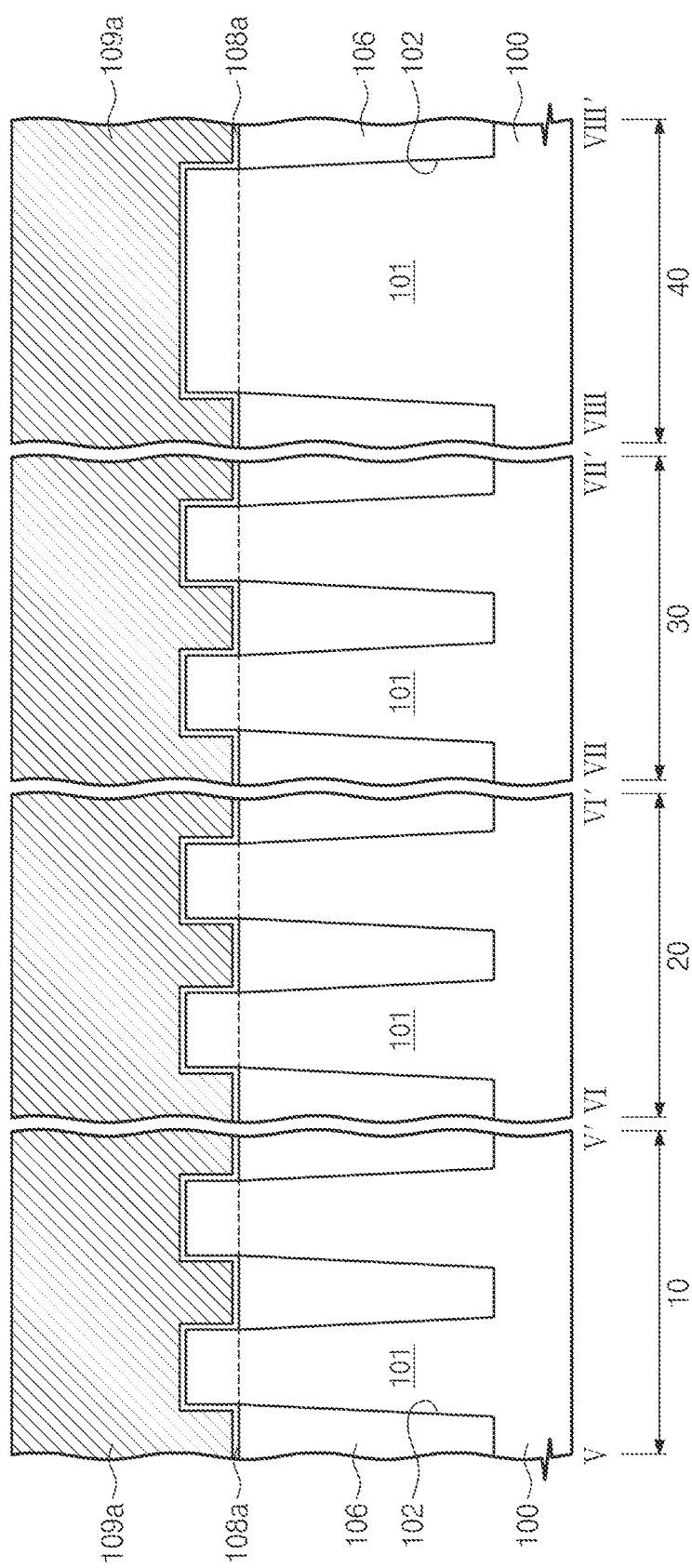

Referring to FIGS. 9A and 9B, the gate insulating layer 108 and the gate sacrificial layer 109 may be patterned to form a gate insulating pattern 108a and a gate sacrificial pattern 109a that are sequentially stacked on each of the first to fourth regions 10, 20, 30, and 40 of the substrate 100. Widths of the gate insulating pattern 108a and the gate sacrificial pattern 109a formed on the fourth region 4Q of the substrate 100 may be greater than widths of the gate insulating patterns 108a and the gate sacrificial patterns 109a formed on the first to third regions 10, 20, and 30 of the substrate 100.

Portions of the substrate 100, which are exposed by the gate sacrificial patterns 109a, may correspond to preliminary source/drain regions 103. In more detail, the preliminary source/drain regions 103 may be portions of the active regions 101 which are disposed at both sides of each of the gate sacrificial patterns 109a.

Figure 10B:
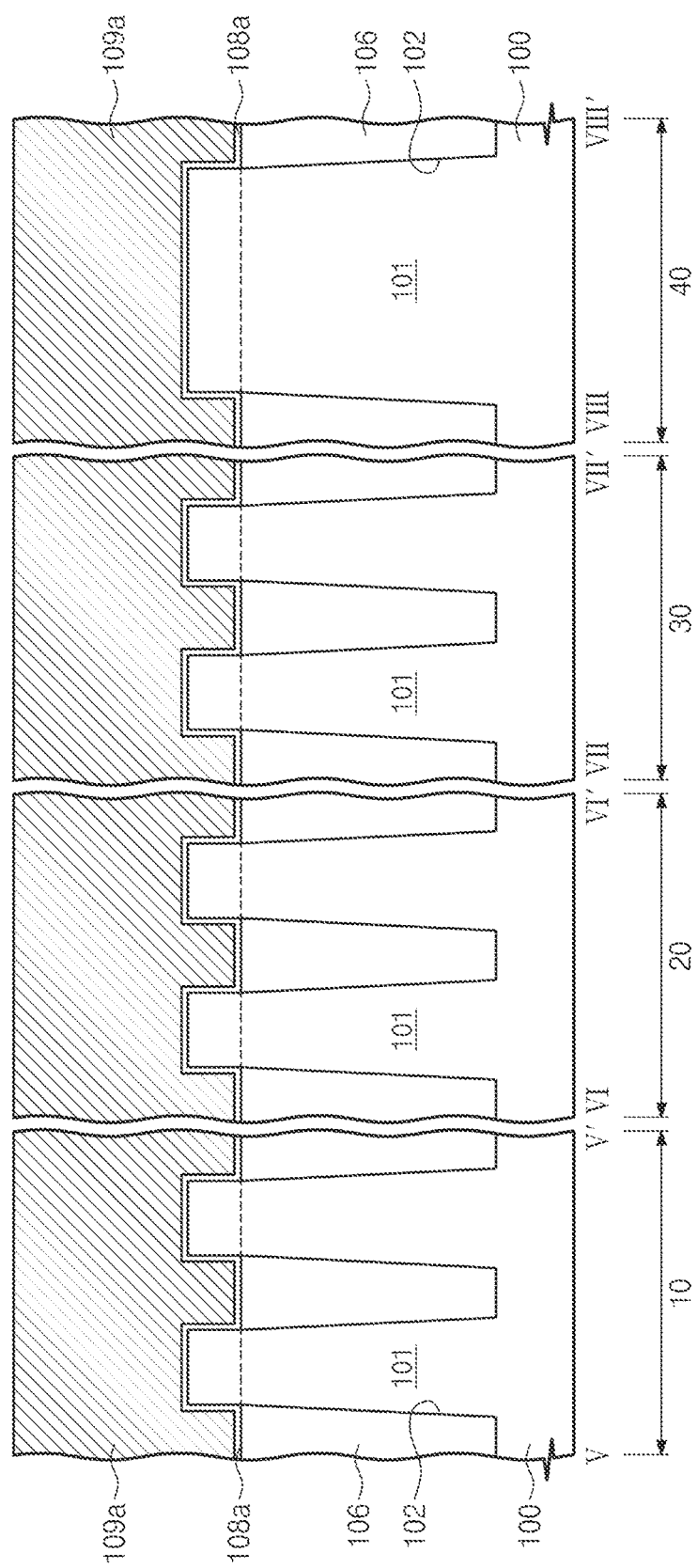

Referring to FIGS. 10A and 10B, spacers 201 may be formed on both sidewalls of each of the gate sacrificial patterns 109a. For example, an insulating layer may be conformally formed on the top surface of the substrate 100, gate insulating patterns 108a and the gate sacrificial patterns 109a. Subsequently, the insulating layer may be etched by, for example, an etch-back process until the preliminary source/drain regions 103 are exposed, thereby forming the spacers 201.

Figure 11B:
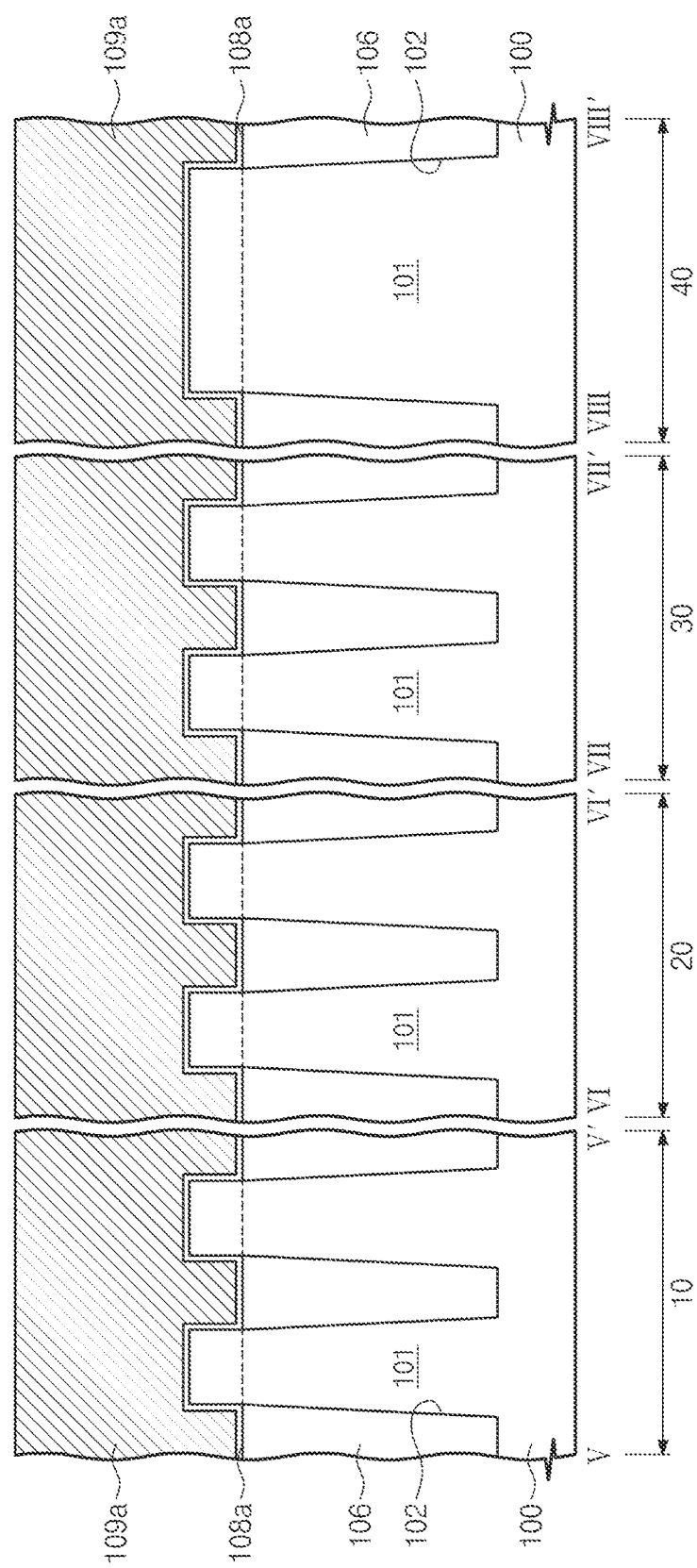

Referring to FIGS. 11A and 11B, source/drain regions 203 may be formed. In more detail, forming the source/drain regions 203 may include removing the preliminary source/drain regions 103, and forming epitaxial layers on portions of the active regions 101 exposed by the removal of the preliminary source/drain regions 103. If the semiconductor device includes a complementary MOS (CMOS) structure, forming the epitaxial layers may include forming a first epitaxial layer used for a source/drain region of an NMOS transistor, and forming a second epitaxial layer used for a source/drain region of a PMOS transistor. The first epitaxial layer may be formed of a semiconductor material inducing a tensile strain, for example, silicon (Si), silicon-germanium (SiGe), or silicon carbide (SiC). The second epitaxial layer may be formed of a semiconductor material inducing a compressive strain, for example, silicon-germanium (SiGe). Since the epitaxial layers are grown, top surfaces of the source/drain regions 203 may protrude from top surfaces of the fins 107.

Figure 12B:
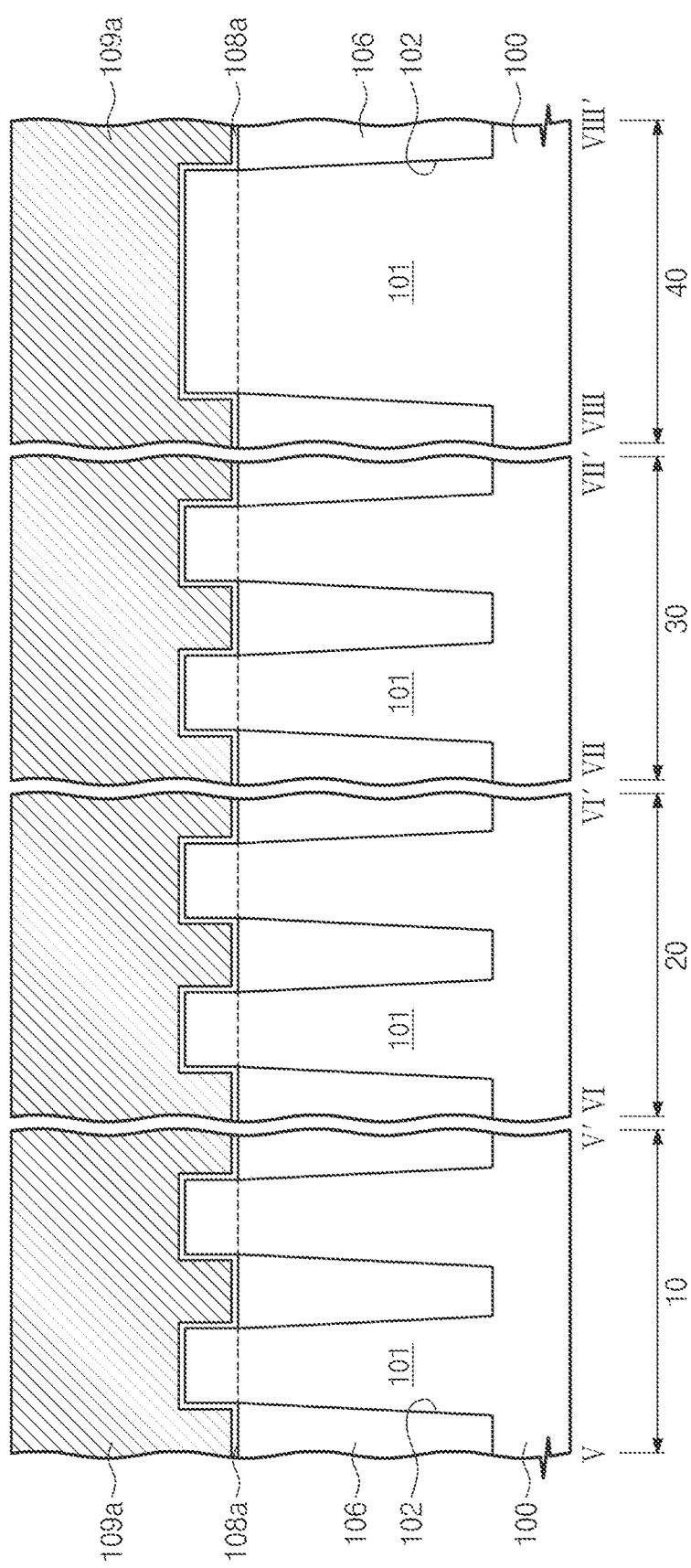

Referring to FIGS. 12A and 12B, a lower interlayer insulating layer 205 may be formed on the substrate 100. The lower interlayer insulating layer 205 may be formed to cover the source/drain regions 203. In addition, the lower interlayer insulating layer 205 may be formed to expose top surfaces of the gate sacrificial patterns 109a. The lower interlayer insulating layer 205 may include at least one of a silicon oxide layer, a silicon nitride layer, a silicon oxynitride layer, or a low-k dielectric layer.

Figure 13A:
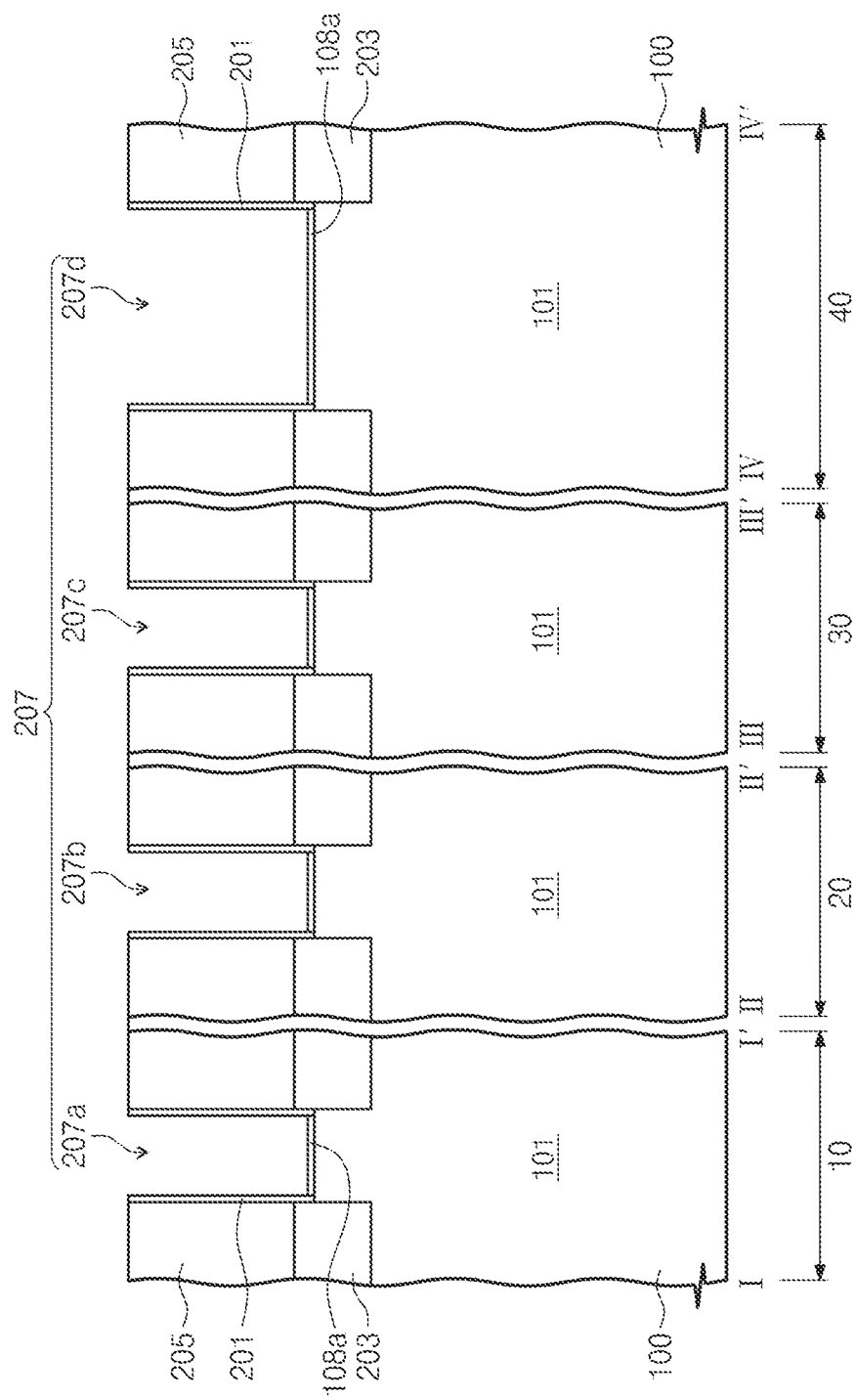
Figure 13B:
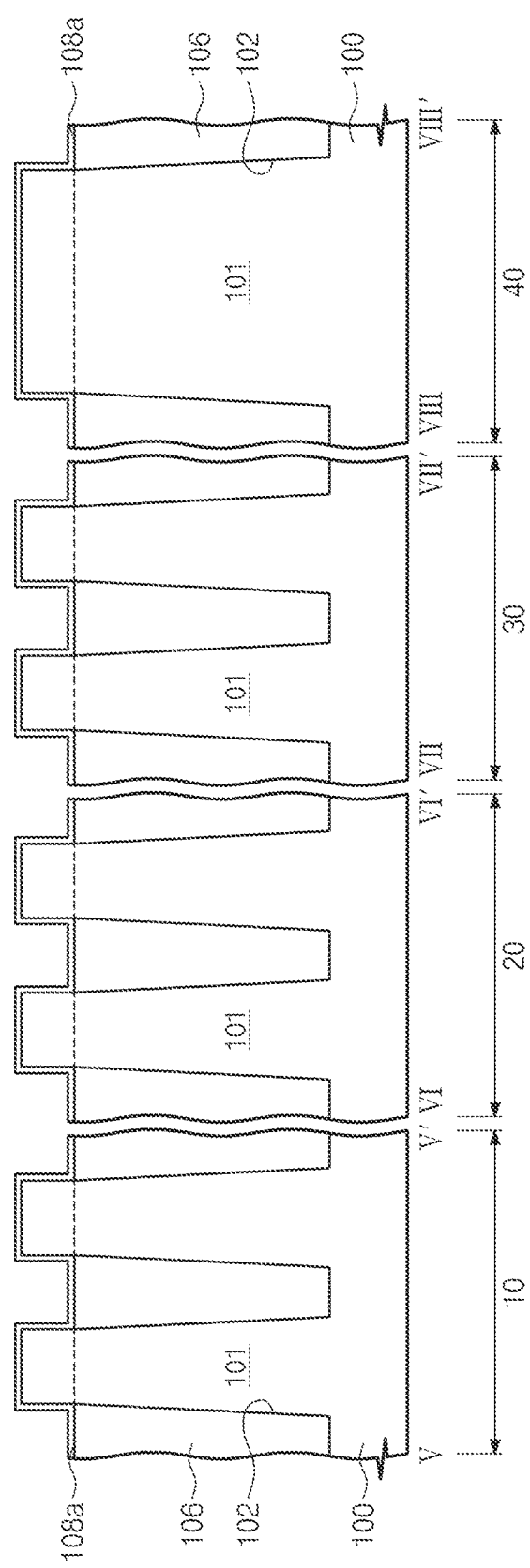

Referring to FIGS. 13A and 13B, the gate sacrificial patterns 109a may be selectively removed to form gap regions 207. In more detail, a first gap region 207a, a second gap region 207b, a third gap region 207c, and a fourth gap region 207d may be formed on the first region 10, the second region 20, the third region 30, and the fourth region 40, respectively. The gate insulating patterns 108a and the spacers 201 may be exposed by the gap regions 207. The gate sacrificial patterns 109a may be selectively removed using an etch recipe having an etch selectivity with respect to the gate insulating patterns 108a, the spacers 201, and the lower interlayer insulating layer 205.

Figure 14B:
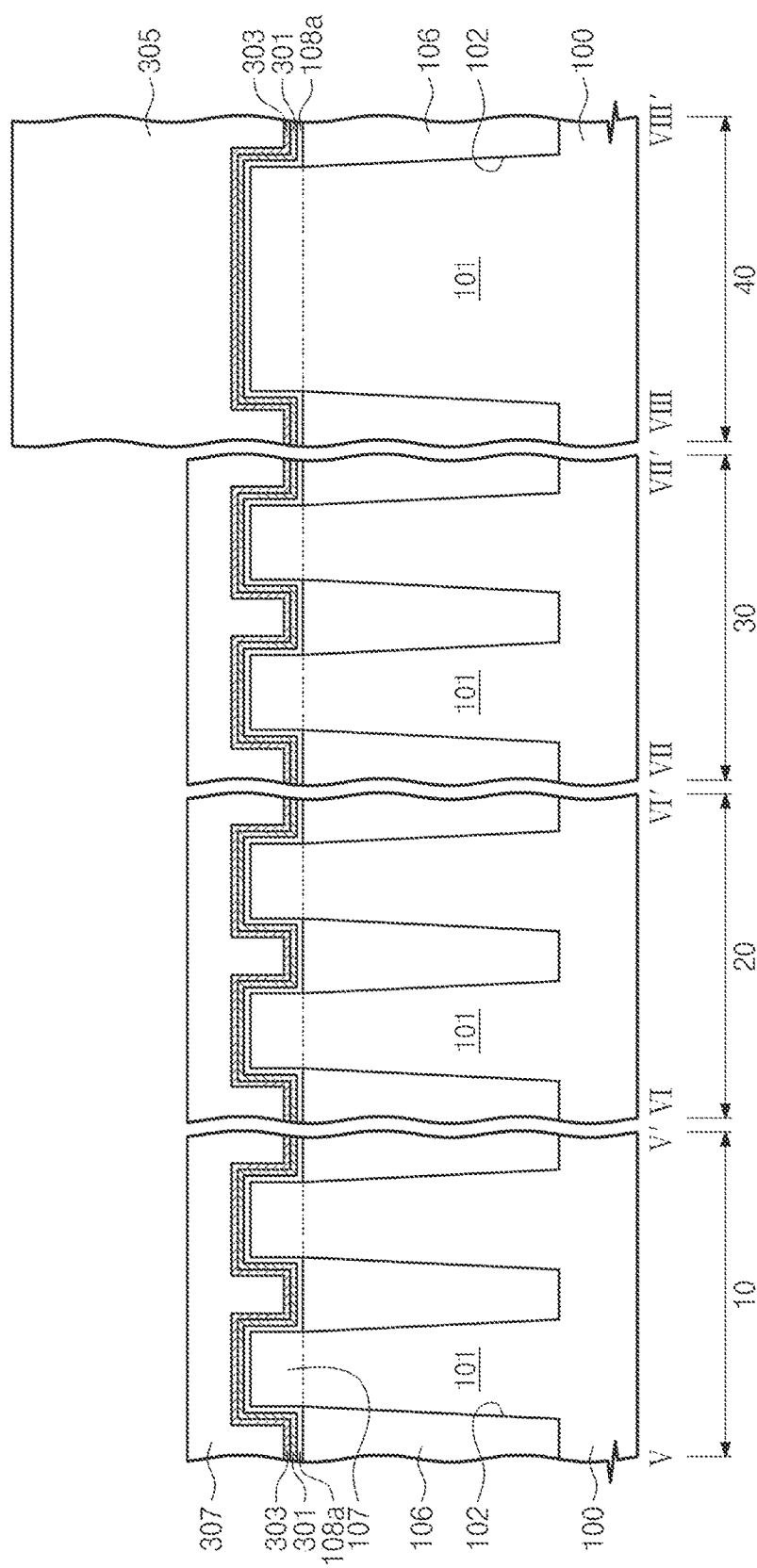

Referring to FIGS. 14A and 14B, a lower work-function electrode layer 301 and a first middle work-function electrode layer 303 may be sequentially formed on the substrate 100 having the first to fourth gap regions 207a, 207b, 207c, and 207d. In more detail, the lower work-function electrode layer 301 may be conformally formed to cover the gate insulating patterns 108a and the spacers 201 and to extend onto the top surface of the lower interlayer insulating layer 205. In other words, the lower work-function electrode layer 301 may conformally cover bottom surfaces and inner sidewalls of the first to fourth gap regions 207a, 207b, 207c, and 207d. The first middle work-function electrode layer 303 may be conformally formed on the lower work-function electrode layer 301.

The lower work-function electrode layer 301 and the first middle work-function electrode layer 303 may include a conductive material having a predetermined work function. The lower work-function electrode layer 301 and the first middle work-function electrode layer 300 may be formed of the same material or different materials. In some embodiments, the lower work-function electrode layer 301 and the first middle work-function electrode layer 303 may include at least one of a metal (e.g., tantalum (Ta), titanium (Ti), aluminum (Al), hafnium (Hf), tungsten (W), or molybdenum (Mo)), a nitride including the metal, a carbide including the metal, a silicon-nitride including the metal, or a silicide including the metal. In some embodiments, the lower work-function electrode layer 301 and the first middle work-function electrode layer 303 may include at least one of hafnium oxide ($HfO_2$), hafnium-silicon oxide (HfSiO), hafnium-silicon oxynitride (HfSiON), hafnium oxynitride (HfON), hafnium-aluminum oxide (HfAlO), hafnium-lanthanum oxide (HfLaO), zirconium oxide ($ZrO_2$), tantalum oxide ($TaO_2$), zirconium-silicon oxide (ZrSiO), or lanthanum oxide ($La_2O_3$).

After the formation of the first middle work-function electrode layer 303, a second mask pattern 305 may be formed on the substrate 100 of the fourth region 40. The second mask pattern 305 may be formed on the first middle work-function electrode layer 303 to fill the fourth gap region 207d. The second mask pattern 305 may be formed of, for example, silicon nitride.

First hard mask patterns 307 may be formed on the first to third regions 10, 20, and 30, respectively. The first mask patterns 307 may partially fill the first, second and third gap regions 207a, 207b, and 207b on the first middle work-function electrode layer 300, respectively. The first hard mask patterns 307 may be recessed to have top surfaces lower than the top surface of the lower interlayer insulating layer 205. The first hard mask patterns 307 may be formed of a carbon-based spin-on-hardmask (C-SOH) material, a silicon-based spin-on-hardmask (S-SOH) material, or a bottom anti-reflective coating (BARC) material.

Figure 15A:
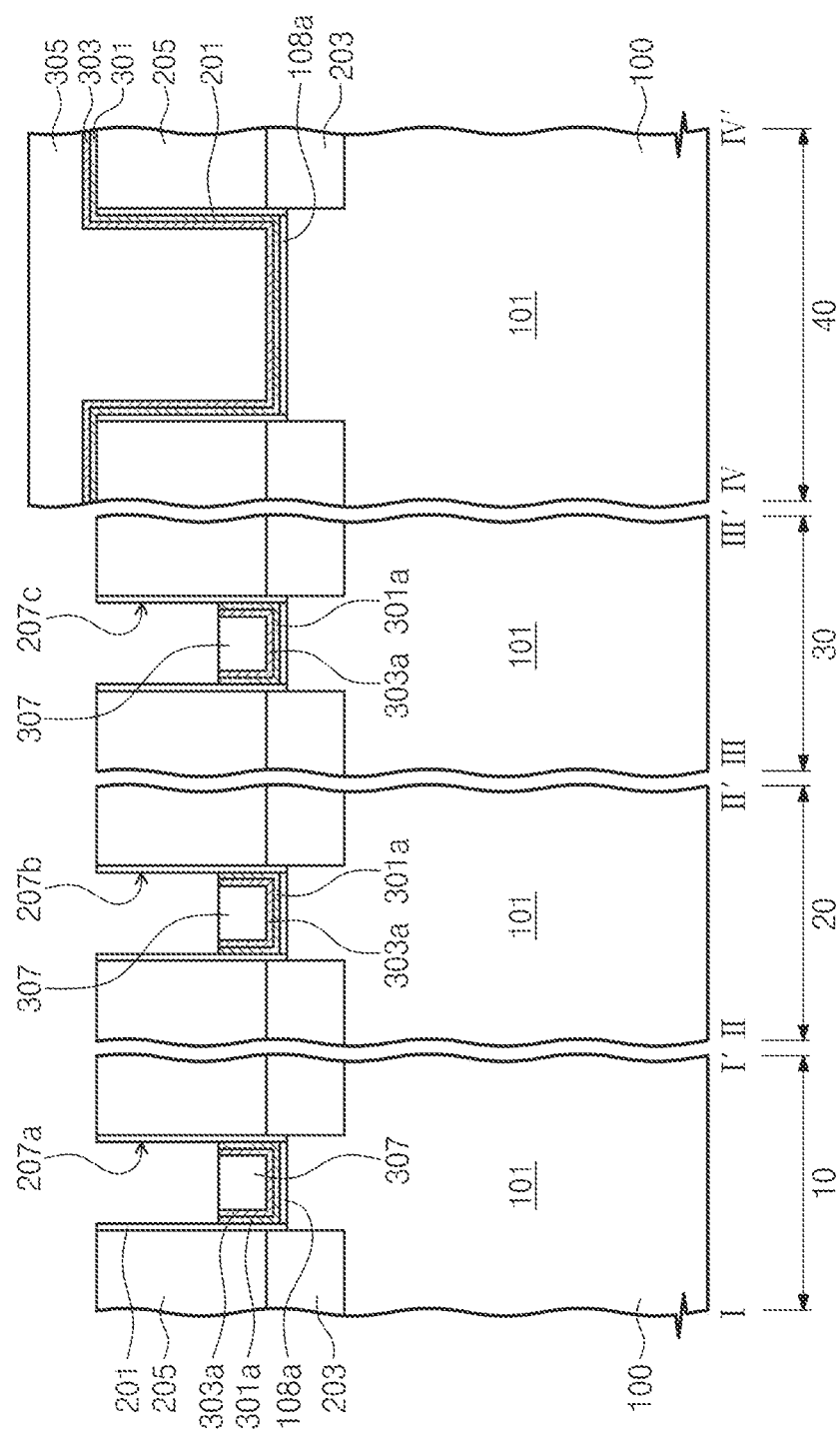
Figure 15B:
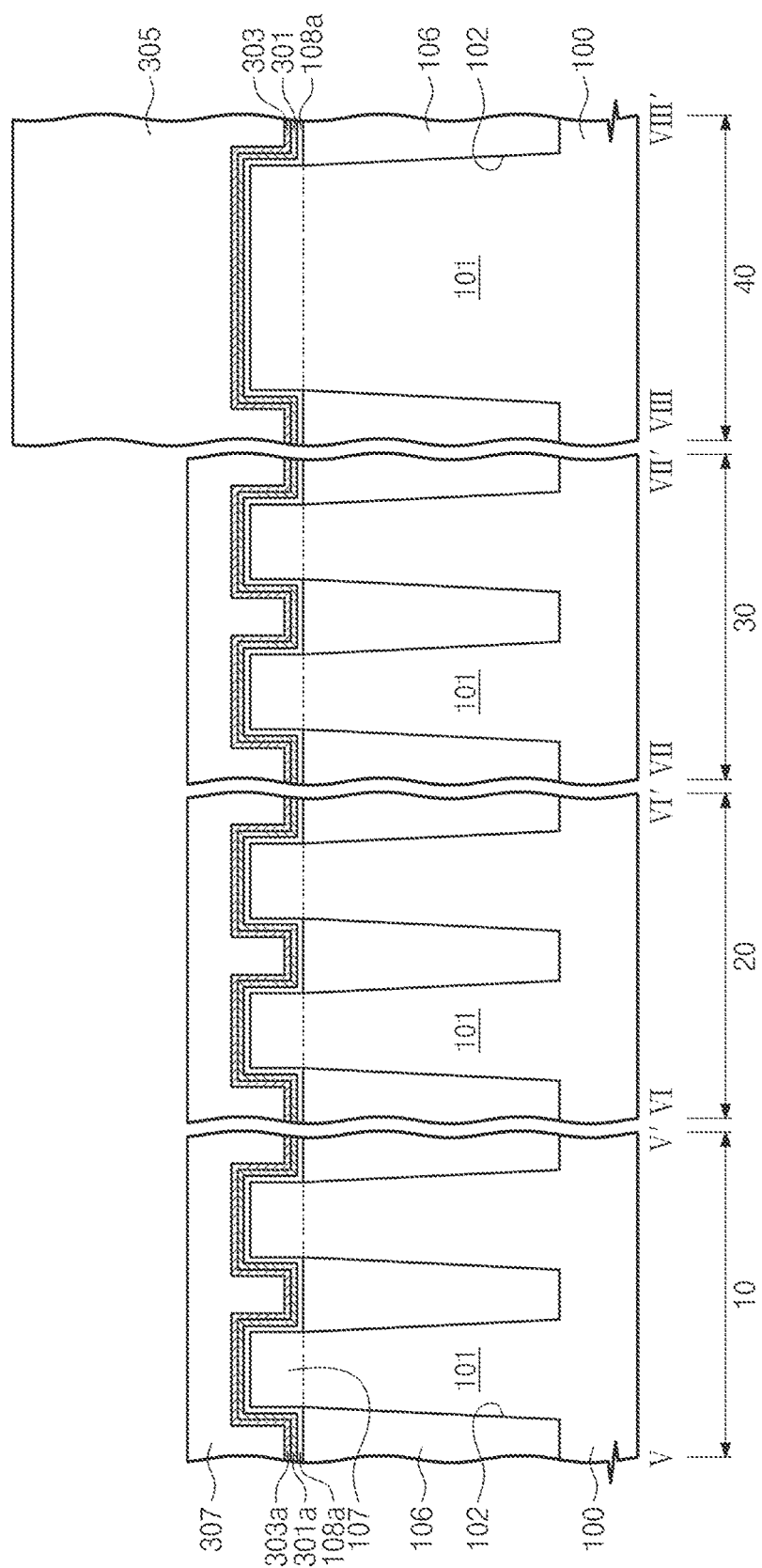

Referring to FIGS. 15A and 15B, the lower work-function electrode layer 301 and the first middle lower work-function electrode layer 303 which are exposed by the first hard mask patterns 307 may be removed to from a lower work-function electrode pattern 301a and a first middle work-function electrode pattern 303a in each of the first to third gap regions 207a, 207b, and 207c. Topmost surfaces of the lower work-function electrode pattern 301a and the first middle work-function electrode pattern 303a may be coplanar with a top surface of the first hard mask pattern. Since the lower work-function electrode pattern 301a and the first middle work-function electrode pattern 303a are formed, upper portions of the spacers 201 may be exposed in the first to third gap regions 207a, 207b, and 207c.

Figure 16B:
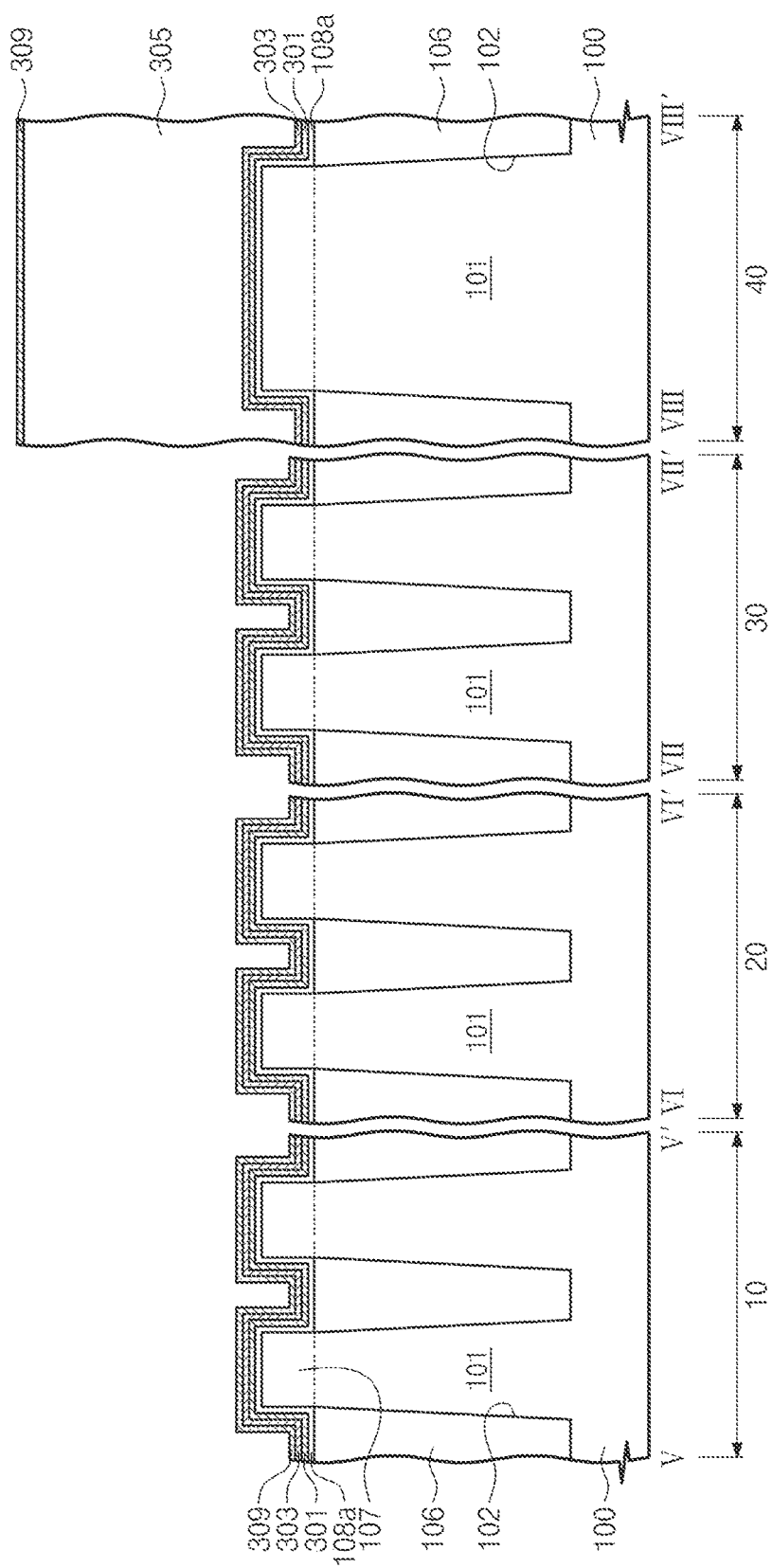

Referring to FIGS. 16A and 16B, the first hard mask patterns 307 may be removed. Thereafter, a second middle work-function electrode layer 309 may be formed on the first middle work-function electrode patterns 303a. In more detail, the second middle work-function electrode layer 309 may be conformally formed on inner surfaces of the first to third gap regions 207a, 207b, and 207c and the top surface of the lower interlayer insulating layer 205 to cover the first middle work-function electrode patterns 303a and the spacers 201. The second middle work-function electrode layer 309 may be formed of the same material as the first middle work-function electrode pattern 303a. In some embodiments, the second middle work-function electrode layer 309 may include at least one of a metal (e.g., tantalum (Ta), titanium (Ti), aluminum (Al), hafnium (Hf), tungsten (W), or molybdenum (Mo)), a nitride including the metal, a carbide including the metal, a silicon-nitride including the metal, or a silicide including the metal. In some embodiments, the second middle work-function electrode layer 309 may include at least one of hafnium oxide ($HfO_2$), hafnium-silicon oxide (HfSiO), hafnium-silicon oxynitride (HfSiON), hafnium oxynitride (HfON), hafnium-aluminum oxide (HfAlO), hafnium-lanthanum oxide (HfLaO), zirconium oxide ($ZrO_2$), tantalum oxide ($TaO_2$), zirconium-silicon oxide (ZrSiO), or lanthanum oxide ($La_2O_3$).

Figure 17A:
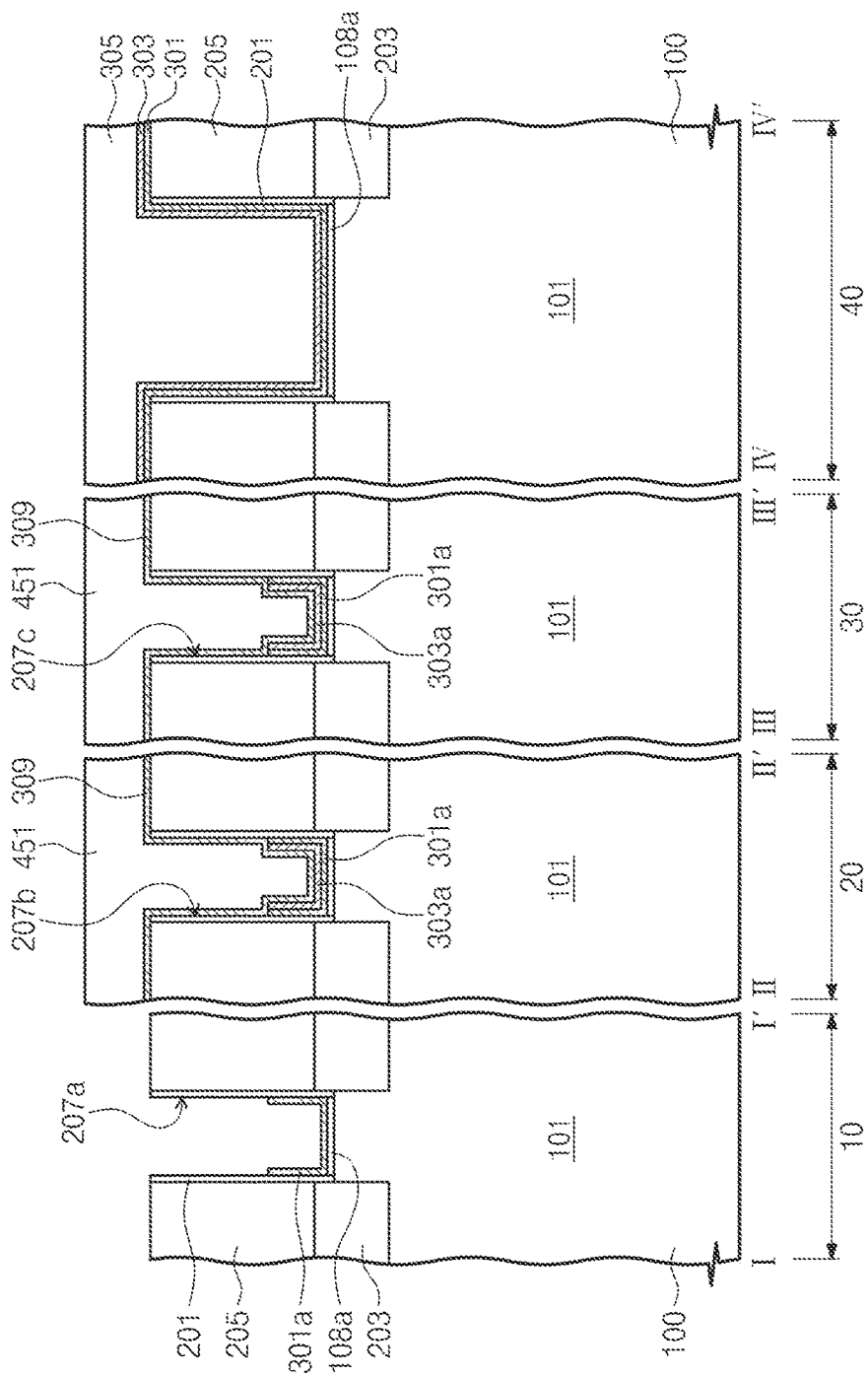
Figure 17B:
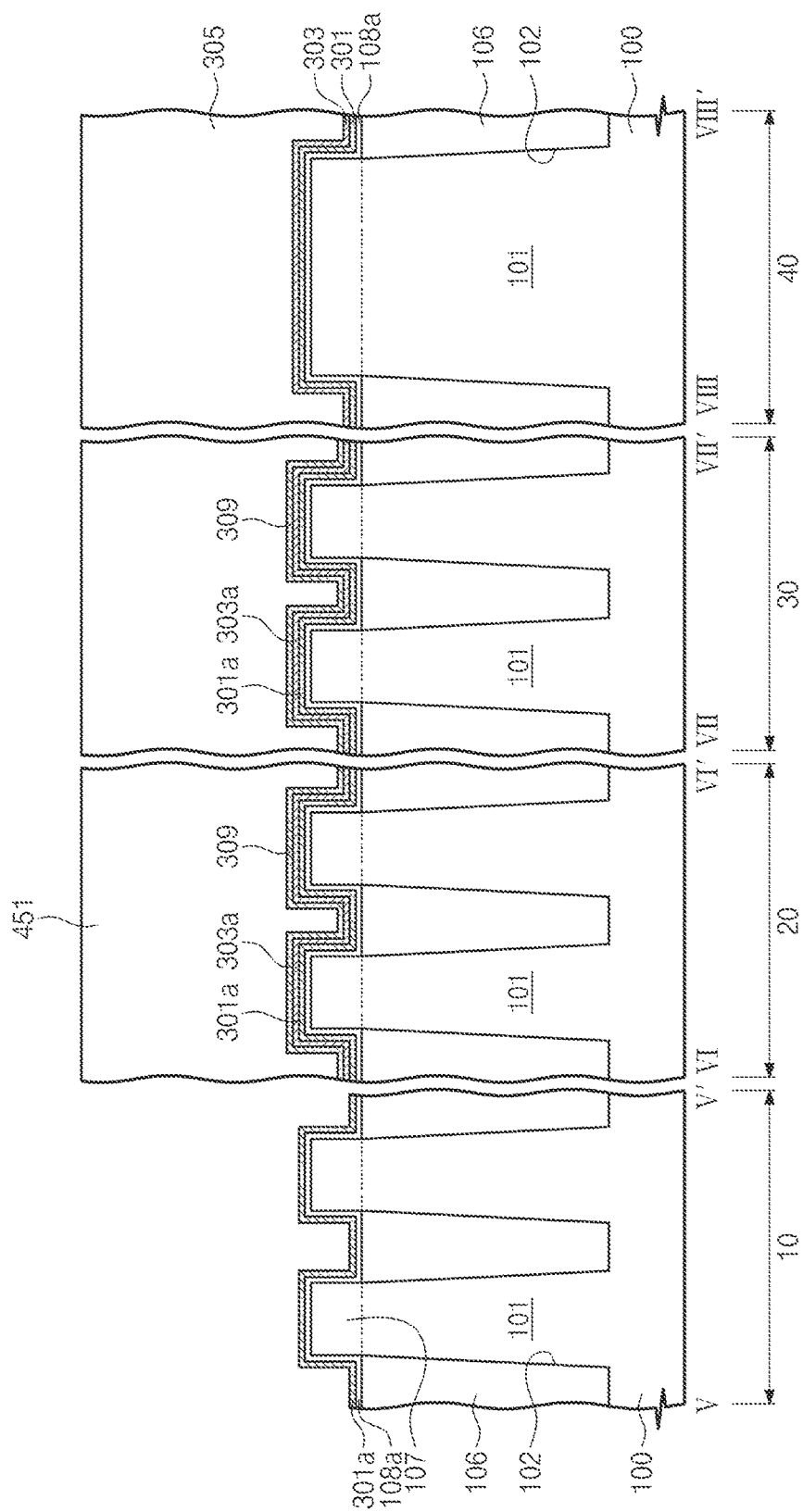

Referring to FIGS. 17A and 17B, a third mask pattern 451 may be formed on the second and third regions 20 and 30 on which the second and third gap regions 207b and 207c are formed. The third mask pattern 451 may cover the second middle work-function electrode layer 309 of the second and third regions 20 and 30 and may fill the second and third gap regions 207b and 207c. The third mask pattern 451 may include, for example, a spin-on-hardmask (SOH) material.

The second middle work-function electrode layer 309 not covered by the third mask pattern 451 may be patterned. In more detail, the second middle work-function electrode layer 309 formed on the first region 10 may be removed. At this time, the first middle work-function electrode pattern 303a formed in the first gap region 207a may also be removed. Thus, the lower work-function electrode pattern 301a and spacers 201 formed in the first gap region 207a may be exposed. The second middle work-function electrode layer 309 of the fourth region 40 may be removed together with the second middle work-function electrode layer 309 of the first region 10.

Figure 18B:
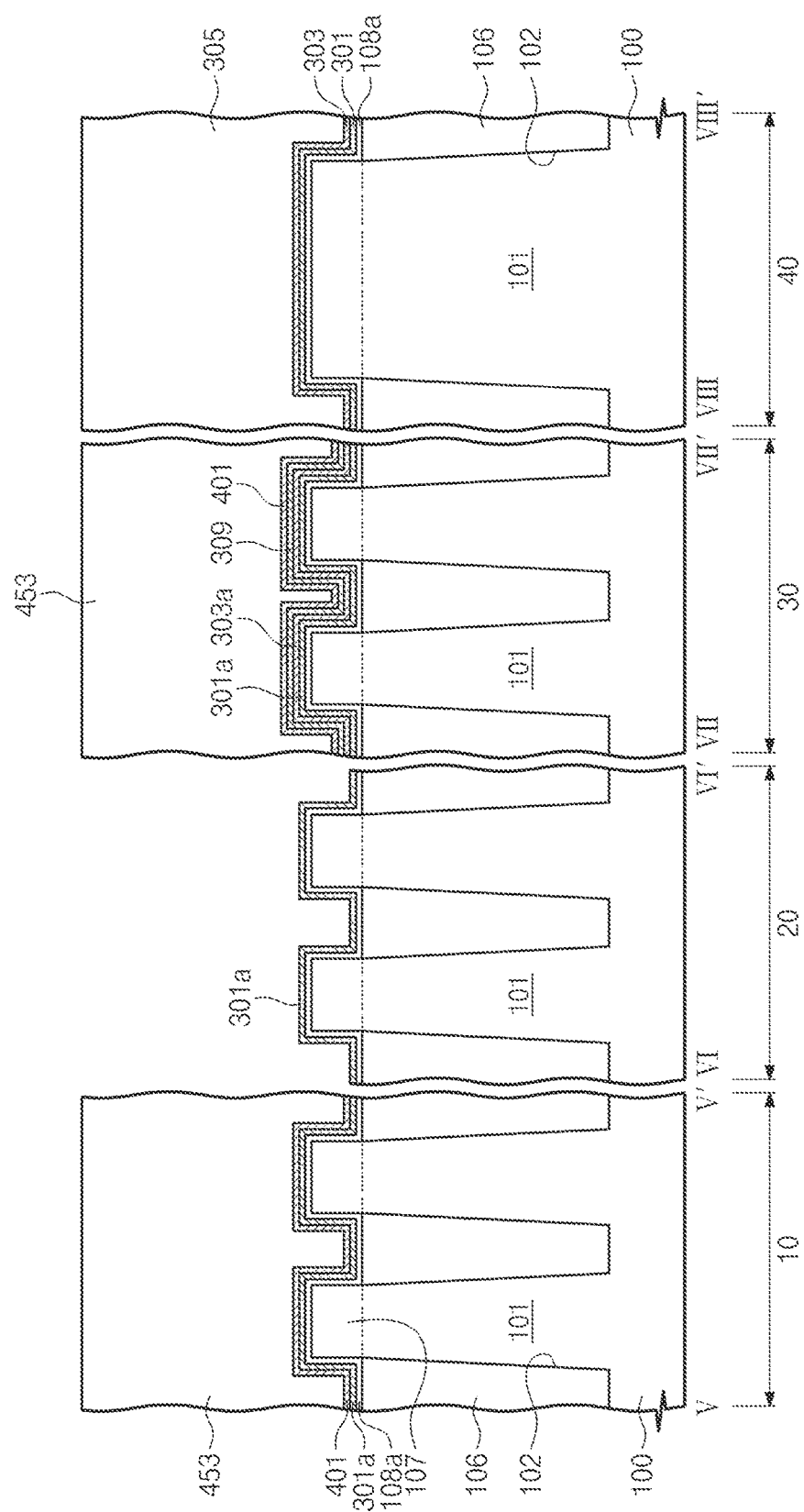

Referring to FIGS. 18A and 18B, the third mask pattern 451 may be selectively removed after the second middle work-function electrode layer 309 is patterned.

A first upper work-function electrode layer 401 may be formed on the substrate 100. The first upper work-function electrode layer 401 of the first region 10 may be conformally formed on the inner surface of the first gap region 207a and the top surface of the lower interlayer insulating layer 205 to cover inner sidewalls of the lower work-function electrode pattern 301a and sidewalls of the spacers 201. The first upper work-function electrode layer 401 of the second and third regions 20 and 30 may conformally cover the second middle work-function electrode layer 309. The first upper work-function electrode layer 401 of the fourth region 40 may be formed on the second mask pattern 305. The first upper work-function electrode layer 401 may be formed of the same material as the second middle work-function electrode layer 309. In some embodiments, the first upper work-function electrode layer 401 may include at least one of a metal (e.g., tantalum (Ta), titanium (Ti), aluminum (Al), hafnium (Hf), tungsten (W), or molybdenum (Mo)), a nitride including the metal, a carbide including the metal, a silicon-nitride including the metal, or a silicide including the metal. In some embodiments, the first upper work-function electrode layer 401 may include at least one of hafnium oxide ($HfO_2$), hafnium-silicon oxide (HfSiO), hafnium-silicon oxynitride (HfSiON), hafnium oxynitride (HfON), hafnium-aluminum oxide (HfAlO), hafnium-lanthanum oxide (HfLaO), zirconium oxide ($ZrO_2$), tantalum oxide ($TaO_2$), zirconium-silicon oxide (ZrSiO), or lanthanum oxide ($La_2O_3$).

A fourth mask pattern 453 may be formed on the first and third regions 10 and 30 of the substrate 100. The fourth mask pattern 453 may fill the first and third gap regions 207a and 207c. The fourth mask pattern 453 may include, for example, a SOH material.

The first upper work-function electrode layer 401 not covered by the fourth mask pattern 453 may be patterned. In more detail, the first upper work-function electrode layer 401 formed on the second region 20 may be removed. At this time, the second middle work-function electrode layer 309 and the first middle work-function electrode pattern 303a on the second region 20 may also be removed. Thus, the lower work-function electrode pattern 301a and the spacers 201 in the second gap region 207b may be exposed. The first upper work-function electrode layer 401 of the fourth region 40 may be removed together with the first upper work-function electrode layer 401 of the second region 20.

Figure 19A:
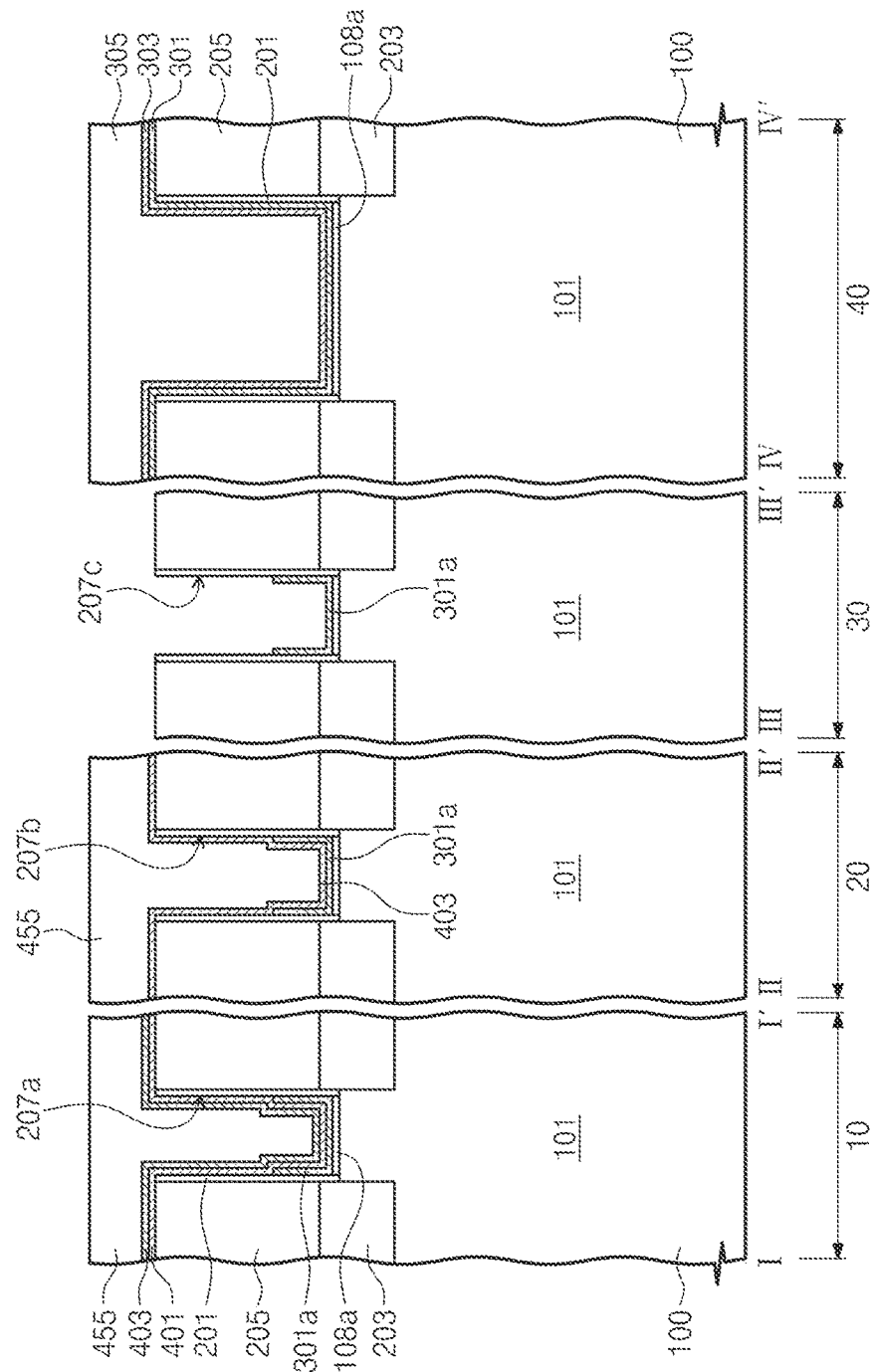

Referring to FIGS. 19A and 19B, the fourth mask pattern 453 may be removed after the first upper work-function electrode layer 401 is patterned.

A second upper work-function electrode layer 403 may be formed on the substrate 100. The second upper work-function electrode layer 403 of the first region 10 may be conformally cover the first upper work-function electrode layer 401 and the top surface of the lower interlayer 205. The second upper work-function electrode layer 403 of the second region 20 may be conformally formed on the inner surface of the second gap region 207b and the top surface of the lower interlayer insulating layer 205 to cover the lower work-function electrode pattern 301a and the spacers 201 formed in the second gap region 207b. The second upper work-function electrode layer 403 of the third region 30 may conformally cover the first upper work-function electrode layer 401 and the top surface of the lower interlayer insulating layer 205. The second upper work-function electrode layer 403 of the fourth region 40 may be formed on the second mask pattern 305.

The second upper work-function electrode layer 403 may be formed of the same material as the first upper work-function electrode layer 401. In some embodiments, the second upper work-function electrode layer 403 may include at least one of a metal (e.g., tantalum (Ta), titanium (Ti), aluminum (Al), hafnium (Hf), tungsten (W), or molybdenum (Mo)), a nitride including the metal, a carbide including the metal, a silicon-nitride including the metal, or a silicide including the metal. In some embodiments, the second upper work-function electrode layer 403 may include at least one of hafnium oxide ($HfO_2$), hafnium-silicon oxide (HfSiO), hafnium-silicon oxynitride (HfSiON), hafnium oxynitride (HfON), hafnium-aluminum oxide (HfAlO), hafnium-lanthanum oxide (HfLaO), zirconium oxide (ZrO$_2$), tantalum oxide (TaO$_2$), zirconium-silicon oxide (ZrSiO), or lanthanum oxide (La$_2$O$_3$).

Thereafter, a fifth mask pattern 455 may be formed on the first and second regions 10 and 20 of the substrate 100. The fifth mask pattern 455 may fill the first and second gap regions 207a and 207b. For example, the fifth mask pattern 455 may include a SOH material.

The second upper work-function electrode layer 403 not covered by the fifth mask pattern 455 may be patterned. In more detail, the second upper work-function electrode layer 403 formed on the third region 30 may be removed. At this time, the second middle work-function electrode layer 309 and the first middle work-function electrode pattern 303a in the third gap region 207c may also be removed. Thus, the lower work-function electrode pattern 301a and the spacers 201 in the third gap region 207c may be exposed. The second upper work-function electrode layer 403 of the fourth region 40 may be removed together with the second upper work-function electrode layer 403 of the third region 30.

Figure 20A:
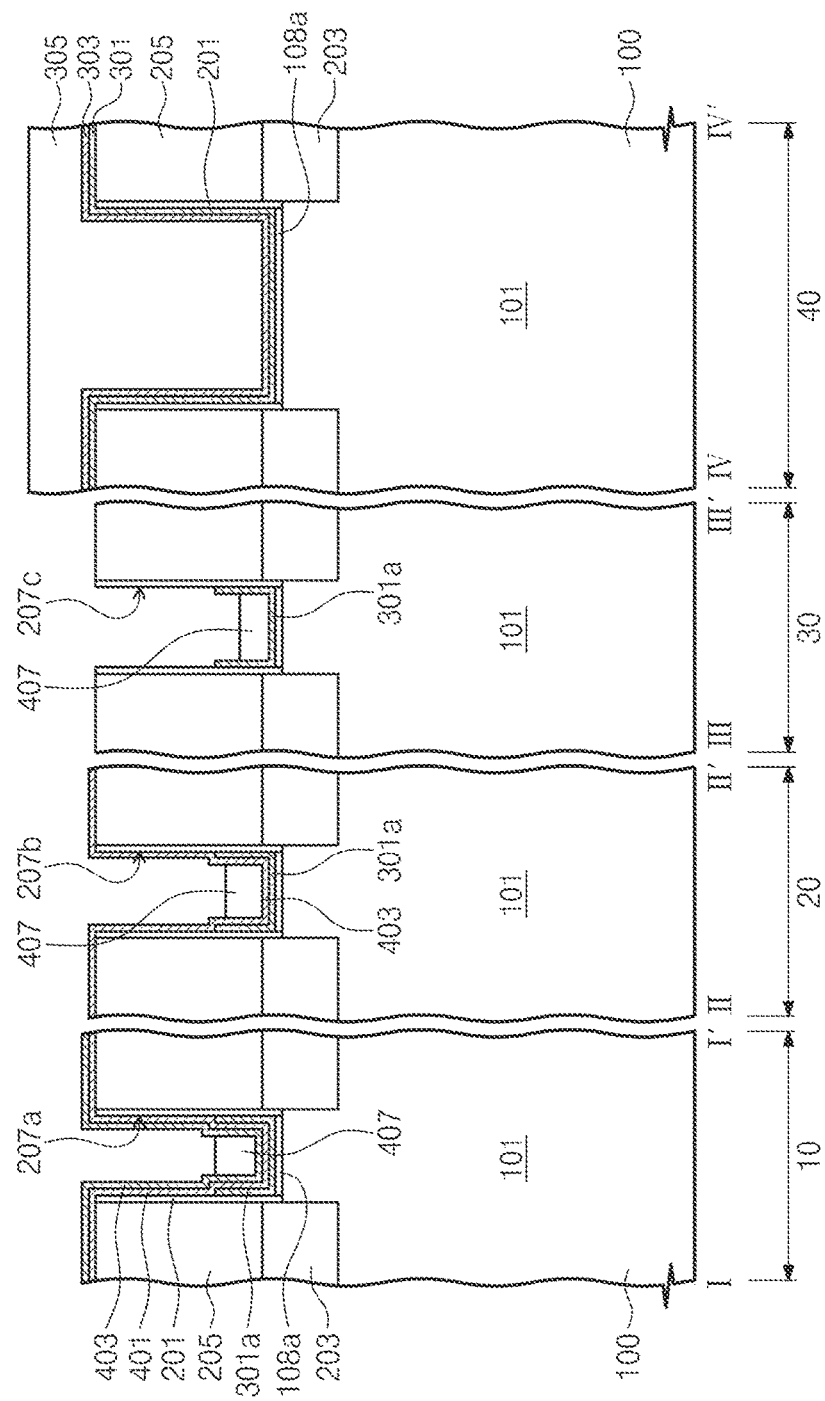

Referring to FIGS. 20A and 20B, the fifth mask pattern 455 may be removed after the second upper work-function electrode layer 403 is patterned.

Second hard mask patterns 407 may be formed in the first, second and third gap regions 207a, 207b, and 207c, respectively. In more detail, the second hard mask patterns 407 may partially fill the first to third gap regions 207a, 207b, and 207c. Top surfaces of the second hard mask patterns 407 may be lower than the top surface of the lower interlayer insulating layer 205a. The top surfaces of the second hard mask patterns 407 in the first to third gap regions 207a, 207b, and 207c may be disposed at different levels from each other. In some embodiments, the top surface of the second hard mask pattern 407 formed in the first gap region 207a may be higher than the top surfaces of the second hard mask patterns 407 formed in the second and third gap regions 207b and 207c, and the top surface of the second hard mask pattern 407 formed in the second gap region 207b may be higher than the top surface of the second hard mask pattern 407 formed in the third gap region 207c. This is because the number of the work-function electrode layers formed in the first gap region 207a is greater than the number of the word-function electrode layers formed in each of the second and third gap regions 207b and 207c such that a width of the second hard mask pattern 407 formed in the first region 207a is less than those of the second hard mask patterns 407 formed in the second and third gap regions 207b and 207c. For example, the second hard mask patterns 407 may be formed of at least one of a carbon-based spin-on-hardmask (C-SOH) material, a silicon-based spin-on-hardmask (S-SOH), or a bottom anti-reflective coating (BARC) material.

Figure 21A:
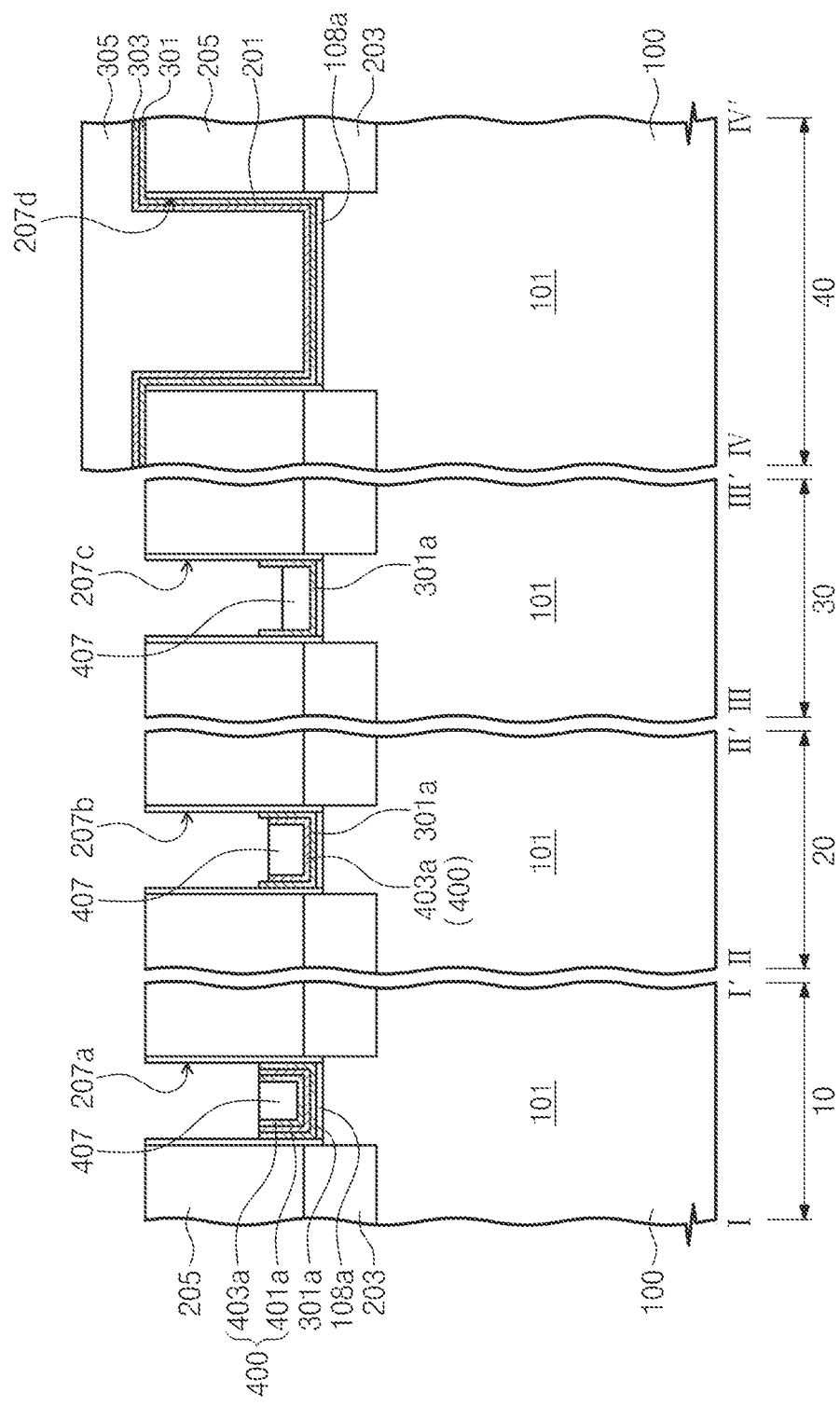
Figure 21B:
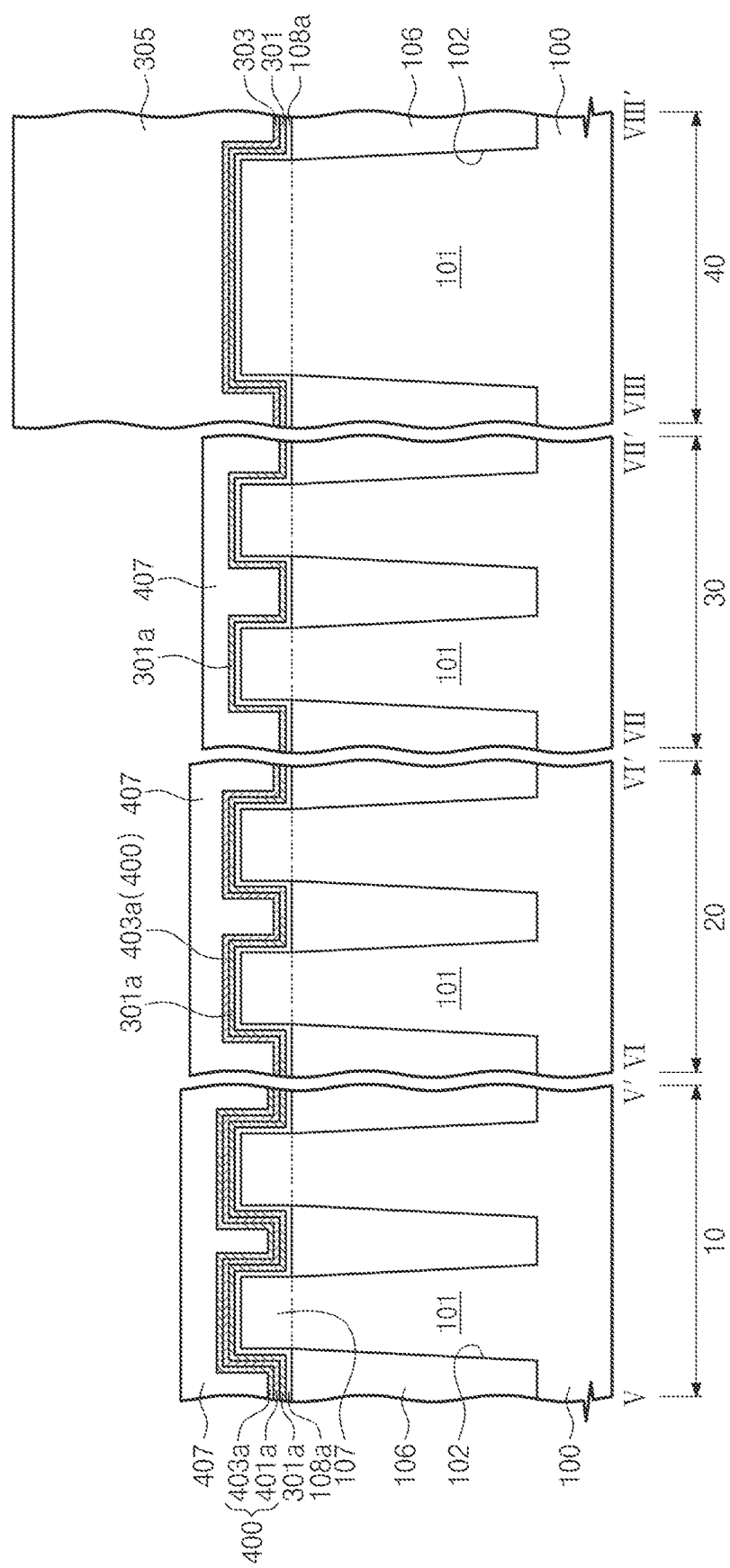

Referring to FIGS. 21A and 21B, the first and second upper work-function electrode layers 401 and 403 exposed by the second hard mask patterns 407 may be removed to form a first upper work-function electrode pattern 401a and a second upper work-function electrode pattern 403a. In more detail, the first and second upper work-function electrode patterns 401a and 403a may be sequentially formed on the lower work-function electrode pattern 301a in the first gap region 207a. The second upper work-function electrode pattern 403a may also be formed on the lower work-function electrode pattern 301a in the second gap region 207b. For the purpose of ease and convenience in explanation, the first and second upper work-function electrode patterns 401a and 403a formed in the first gap region 207a may be defined as an upper work-function electrode pattern 400, and the second upper work-function electrode pattern 403a formed in the second gap region 207b may also be defined as an upper work-function electrode pattern 400.

Since the levels (e.g., heights) of the top surfaces of the second hard mask patterns 407 formed in the first and second gap regions 207a and 207b are different, heights of the upper work-function electrode patterns 400 in the first and second gap regions 207a and 207b may be different from each other. A topmost surface of the upper work-function electrode pattern 400 may be higher or lower than the topmost surface of the lower work-function electrode pattern 301a, such that a resistance of a gate electrode may be varied. Thus, a deposition amount of the second hard mask patterns 407 may be controlled to adjust the height of the upper work-function electrode pattern 400.

A gate electrode may be formed of a conductive material having a predetermined work function to control a threshold voltage of a channel region of a transistor. To form gate electrodes having different characteristics, the gate electrodes may be formed of work-function conductive materials of which thicknesses are different from each other. A deposition process and a patterning process of a work-function electrode layer may be repeatedly performed to form the work-function conductive materials having the different thicknesses in gap regions. A total thickness of the work-function electrode layers may increase in proportion to the number of the work-function electrode layers, such that widths of the gap regions may be reduced. Hard mask patterns in the gap regions may be used as etch masks to remove the work-function electrode layers which are deposited on sidewalls of the gap regions and are exposed by the hard mask patterns. However, since upper regions of the gap regions may become narrow, the hard mask patterns may be poorly formed. Thus, the work-function electrode layer covered by the hard mask patterns may also be etched to be lower than top surfaces of the hard mask patterns.

According to some embodiments of the inventive concept, the work-function electrode layers may be deposited in the first to third gap regions 207a, 207b, and 207c, and a first etching process may be performed to remove the work-function electrode layers which are formed on the sidewalls of the first to third gap regions 207a, 207b, and 207c and are exposed by the first hard mask patterns 307. Thus, widths of upper portions of the first to third gap regions 207a, 207b, and 207c after the first etching process may be equal to those of the upper portions of the first to third gap regions 207a, 207b, and 207c before the deposition of the work-function electrode layers. The deposition process and patterning process of the work-function electrode layer may be repeatedly performed to the work-function electrode layers having different thicknesses from each other in the first to third gap regions 207a, 207b, and 207c, respectively. Subsequently, a second etching process may be performed to remove the work-function electrode layers which are formed on the sidewalls of the first to third gap regions 207a, 207b, and 207c and are exposed by the second hard mask patterns 407. In some embodiments, the etching process of removing the work-function electrode layers formed on the sidewalls of the gap regions may be performed twice. In other words, when the second hard mask patterns 407 may be formed in the gap regions, the upper regions of the gap regions may be sufficiently wide. Thus, the work-function electrode layers may not be recessed to be lower than the top surfaces of the second hard mask patterns 407, and only the portions, which are exposed by the second hard mask patterns 407, of the work-function electrode layers may be removed. This means that the work-function electrode patterns with desired levels and thicknesses may be formed.

Figure 22B:
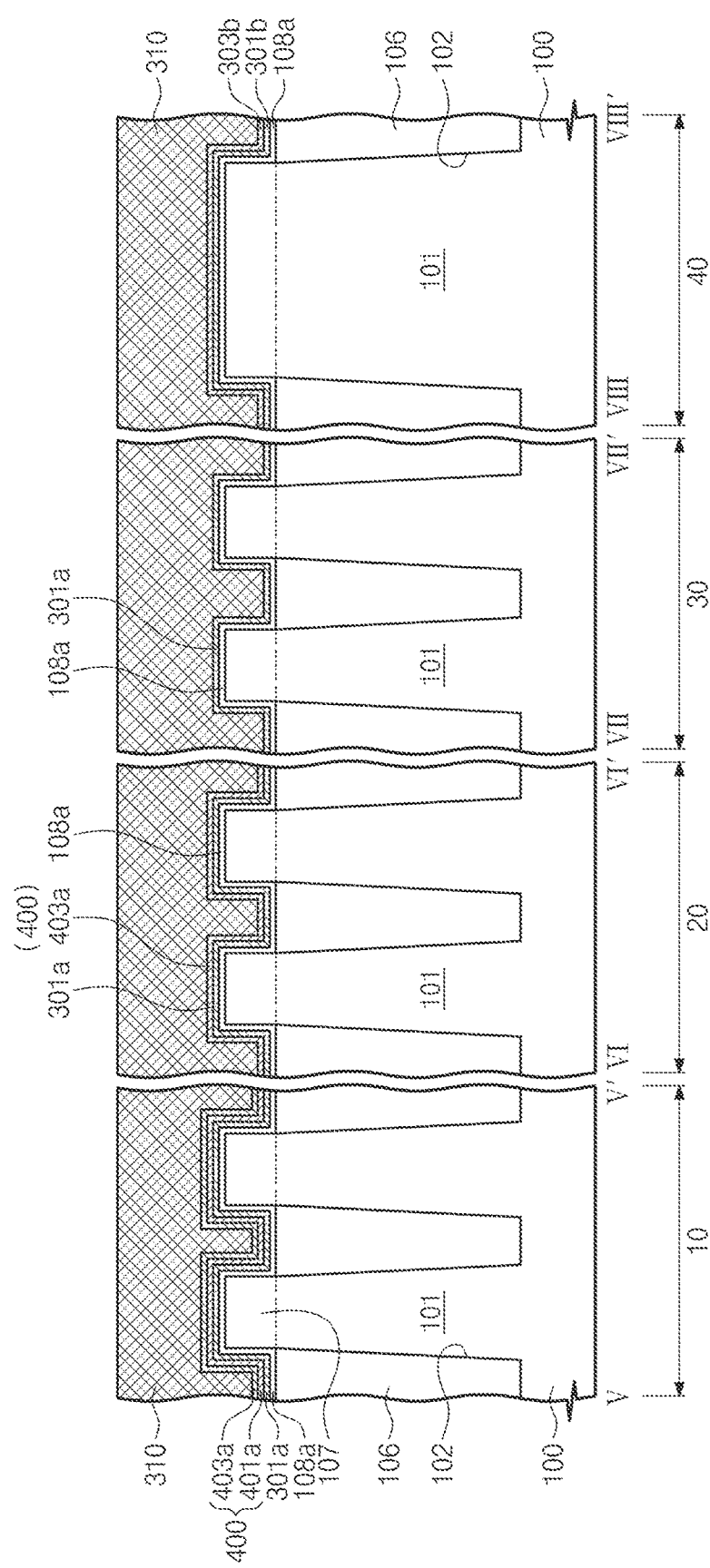

Referring to FIGS. 22A and 22B, the second hard mask patterns 407 and the second mask pattern 305 may be removed.

Metal electrode patterns 310 may be formed in the first to fourth gap regions 207a, 207b, 207c, and 207d, respectively. In more detail, a metal electrode layer may be formed on the lower interlayer insulating layer 205 to fill the first to fourth gap regions 207a, 207b, 207c, and 207d, and the metal electrode layer may be planarized until the lower interlayer insulating layer 205 is exposed, thereby forming the metal electrode patterns 310. The lower work-function electrode layer 301 and the first middle work-function electrode layer 303 on the lower interlayer insulating layer 205 of the fourth region 40 may be removed during the planarization process of the metal electrode layer. Thus, a first work-function electrode pattern 301b and a second work-function electrode pattern 303b may be formed between the inner surface of the fourth gap region 207d and the metal electrode pattern 31Q of the fourth region 40. The metal electrode patterns 310 may be formed of a metal material (e.g., tungsten (W)).

Referring again to FIGS. 2A and 2B, top surfaces of the metal electrode patterns 310 may be recessed by an etching process, such that upper regions of the gap regions 207a, 207b, 207c, and 207d may become empty. The empty regions of the gap regions 207a, 207b, 207c, and 207d may be filled with insulating patterns 321, respectively. An upper interlayer insulating layer 325 may be formed on the lower interlayer insulating layer 205 and the gate electrodes 501, 502, 503, and 504.

Methods of fabricating the semiconductor devices illustrated in FIGS. 3 through 6 may be similar to the method described with reference to FIGS. 7A to 22A and 7B to 22B.

Figure 23:
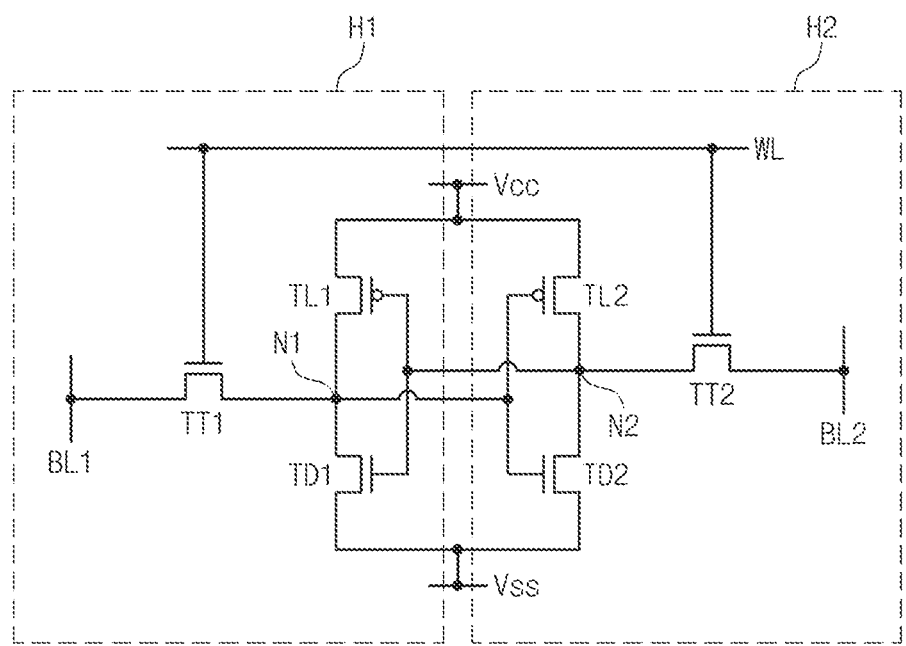
FIG. 23 is an equivalent circuit diagram illustrating a complementary metal-oxide-semiconductor static random access memory (CMOS SRAM) cell in a semiconductor device according to some embodiments of the inventive concept.

FIG. 23 is an equivalent circuit diagram illustrating a complementary metal-oxide-semiconductor static random access memory (CMOS SRAM) cell included in a semiconductor device according to some embodiments of the inventive concept.

Referring to FIG. 23, a CMOS SRAM cell may include a pair of driver transistors TD1 and TD2, a pair of transfer transistors TT1 and TT2, and a pair of load transistors TL1 and TL2. The driver transistors TD1 and TD2 may be pull-down transistors, the transfer transistors TT1 and TT2 may be pass transistors, and the load transistors TL1 and TL2 may be pull-up transistors. The driver transistors TD1 and TD2 and the transfer transistors TT1 and TT2 may be NMOS transistors, and the load transistors TL1 and TL2 may be PMOS transistors. At least one of the field effect transistors according to some embodiments of the inventive concept may be applied to at least one of the driver transistors TD1 and TD2 and the load transistors TL1 and TL2.

The first driver transistor TD1 and the first transfer transistor TT1 may be connected in series to each other. A source region of the first driver transistor TD1 may be electrically connected to a ground line Vss, and a drain region of the first transfer transistor TT1 may be electrically connected to a first bit line BL1. The second driver transistor TD2 and the second transfer transistor TT2 may be connected in series to each other. A source region of the second driver transistor TD2 may be electrically connected to the ground line Vss, and a drain region of the second transfer transistor TT2 may be electrically connected to a second bit line BL2.

A source region and a drain region of the first load transistor TL1 may be electrically connected to a power line Vcc and a drain region of the first driver transistor TD1, respectively. A source region and a drain region of the second load transistor TL2 may be electrically connected to the power line Vcc and a drain region of the second driver transistor TD2, respectively. The drain region of the first load transistor TL1, the drain region of the first driver transistor TD1, and a source region of the first transfer transistor TT1 may be connected to each other to constitute a first node N1. The drain region of the second load transistor TL2, the drain region of the second driver transistor TD2, and a source region of the second transfer transistor TT2 may be connected to each other to constitute a second node N2. A gate electrode of the first driver transistor TD1 and a gate electrode of the first load transistor TL1 may be electrically connected to the second node N2, and a gate electrode of the second driver transistor TD2 and a gate electrode of the second load transistor TL2 may be electrically connected to the first node N1. Gate electrodes of the first and second transfer transistors TT1 and TT2 may be electrically connected to a word line WL. The first driver transistor TD1, the first transfer transistor TT1, and the first load transistor TL1 may constitute a first half cell H1. The second driver transistor TD2, the second transfer transistor TT2, and the second load transistor TL2 may constitute a second half cell H2.

The semiconductor device including the CMOS SRAM cell described above may be a SRAM device or a logic device (e.g., a central processing unit (CPU)) including SRAM cells. However, the inventive concept is not limited thereto. Some embodiments of the inventive concept may be applied to a dynamic random access memory (DRAM) device, a magnetic random access memory (MRAM) device, or another semiconductor device and methods of fabricating the same.

Figure 24:
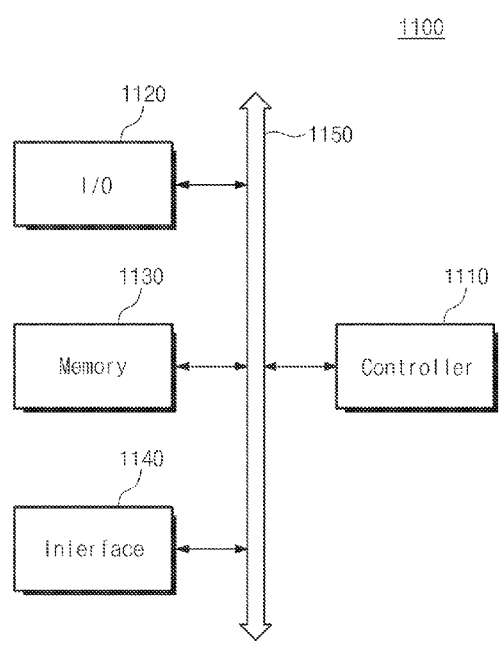
FIG. 24 is a schematic block diagram illustrating an electronic system including a semiconductor device according to some embodiments of the inventive concept.

FIG. 24 is a schematic block diagram illustrating an electronic system including a semiconductor device according to some embodiments of the inventive concept.

Referring to FIG. 24, an electronic system 1100 according to some embodiments of the inventive concept may include a controller 1110, an input/output (I/O) unit 1120, a memory device 1130, an interface unit 1140, and a data bus 1150. At least two of the controller 1110, the I/O unit 1120, the memory device 1130, and the interface unit 1140 may communicate with each other through the data bus 1150. The data bus 1150 may correspond to a path through which electrical signals are transmitted.

The controller 1110 may include at least one of a microprocessor, a digital signal processor, a microcontroller, or another logic device having a similar function to any one thereof. The I/O unit 1120 may include a keypad, a keyboard and/or a display unit. The memory device 1130 may store data and/or commands. The interface unit 1140 may transmit electrical data to a communication network or may receive electrical data from a communication network. The interface unit 1140 may operate by wireless or cable. For example, the interface unit 1140 may include an antenna or a wireless/cable transceiver. The electronic system 1100 may further include a fast DRAM device and/or a fast SRAM device which acts as a cache memory for improving an operation of the controller 1110. At least one of the semiconductor devices according to some embodiments of the inventive concept may be provided into at least one of the memory device 1130, the controller 1110, or the I/O unit 1120.

The electronic system 1100 may be applied to a personal digital assistant (PDA), a portable computer, a web tablet, a wireless phone, a mobile phone, a digital music player, a memory card, or other electronic products receiving or transmitting information data by wireless.

The electronic system 1100 may be applied to electronic control devices of various electronic devices.

Figure 25:
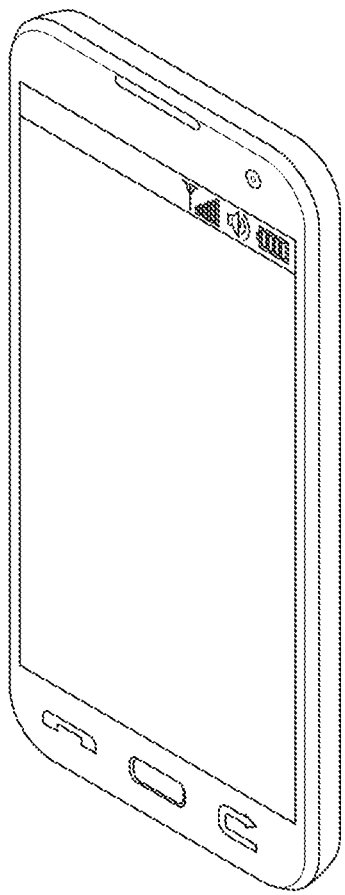
FIG. 25 illustrates a mobile phone implemented with an electronic system including a semiconductor device according to some embodiments of the inventive concept.

FIG. 25 illustrates a mobile phone 1200 implemented with the electronic system 1100 of FIG. 24. In some embodiments, the electronic system 1100 of FIG. 24 may be applied to a portable notebook computer, a MP3 player, a navigation device, a solid state disk (SSD), a car, or household appliances.

According to some embodiments of the inventive concept, the method of fabricating the semiconductor device may include two etching processes of removing work-function electrode layers deposited on the sidewalls of the gap regions. Thus, the upper regions of the gap regions may have sufficiently wide widths. As a result, the work-function electrode layers may not be recessed and may have desired heights.

The above-disclosed subject matter is to be considered illustrative, and not restrictive, and the appended claims are intended to cover all such modifications, enhancements, and other embodiments, which fall within the true spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. A semiconductor device comprising:
a substrate;
a plurality of gate electrodes disposed on the substrate; and
source/drain regions disposed at both sides of each of the plurality of gate electrodes,
wherein each of the plurality of gate electrodes comprises a gate insulating pattern disposed on the substrate, a lower work-function electrode pattern disposed on the gate insulating pattern and comprising a recessed upper surface, and an upper work-function electrode pattern conformally extending on the recessed upper surface of the lower work-function electrode pattern,
wherein topmost surfaces of the lower work-function electrode patterns are disposed at an equal level,
wherein the upper work-function electrode patterns have different thicknesses from each other,
wherein the plurality of gate electrodes comprise a first gate electrode and a second gate electrode,
wherein a topmost surface of the upper work-function electrode pattern of the first gate electrode is disposed at an equal level to the topmost surface of the lower work-function electrode pattern of the first gate electrode, and
wherein a topmost surface of the upper work-function electrode pattern of the second gate electrode is lower than the topmost surface of the lower work-function electrode pattern of the second gate electrode.

2. The semiconductor device of claim 1, wherein the upper work-function electrode pattern of the first gate electrode is thicker than the upper work-function electrode pattern of the second gate electrode.

3. The semiconductor device of claim 1, further comprising:
an additional gate electrode,
wherein the additional gate electrode comprises a work-function electrode pattern having a recessed upper surface,
wherein a bottom surface of the work-function electrode pattern of the additional gate electrode is disposed at an equal level to bottom surfaces of the lower work-function electrode patterns of the first and second gate electrodes, and
wherein a topmost surface of the work-function electrode pattern of the additional gate electrode is higher than the topmost surfaces of the lower work-function electrode patterns of the first and second gate electrodes.

4. The semiconductor device of claim 1, wherein each of the plurality of gate electrodes further comprises a metal electrode pattern, and
wherein each of the metal electrode patterns is disposed on and is in contact with a corresponding one of the upper work-function electrode patterns.

5. A semiconductor device comprising:
a first gate electrode on a substrate, the first gate electrode comprising a first gate insulating pattern, a first lower work-function electrode pattern, a first upper work-function electrode pattern and a first metal electrode pattern that are sequentially stacked on the substrate, wherein the first lower work-function electrode pattern comprises a recessed upper surface, the first upper work-function electrode pattern extends along the recessed upper surface of the first lower work-function electrode pattern thereby defining a first recess therein, and the first metal electrode pattern comprises a lower portion in the first recess; and
a second gate electrode on the substrate, the second gate electrode comprising a second gate insulating pattern, a second lower work-function electrode pattern, a second upper work-function electrode pattern and a second metal electrode pattern that are sequentially stacked on the substrate, wherein the second lower work-function electrode pattern comprises a recessed upper surface, the second upper work-function electrode pattern extends along the recessed upper surface of the second lower work-function electrode pattern thereby defining a second recess therein, and the second metal electrode pattern comprises a lower portion in the second recess,
wherein an uppermost surface of the first lower work-function electrode pattern and an uppermost surface of the second lower work-function electrode pattern are at equal heights,
wherein an uppermost surface of the first upper work-function electrode pattern and the uppermost surface of the first lower work-function electrode pattern are at equal heights, and
wherein an uppermost surface of the second upper work-function electrode pattern is lower than the uppermost surface of the second lower work-function electrode pattern relative to an upper surface of the substrate.

6. The semiconductor device of claim 5, wherein the first lower work-function electrode pattern and the first metal electrode pattern comprise a sidewall of the first gate electrode, and
wherein the second lower work-function electrode pattern and the second metal electrode pattern comprise a sidewall of the second gate electrode.

7. The semiconductor device of claim 6, wherein the first metal electrode pattern contacts the uppermost surface of the first lower work-function electrode pattern, and the second metal electrode pattern contacts the uppermost surface of the second lower work-function electrode pattern.

8. The semiconductor device of claim 5, wherein an upper portion of the first metal electrode pattern and an upper portion of the second metal electrode pattern have equal widths.

9. The semiconductor device of claim 5, wherein the first upper work-function electrode pattern and the second upper work-function electrode pattern have different thicknesses.

10. The semiconductor device of claim 5, wherein a number of layers comprising the first upper work-function electrode pattern is greater than a number of layers comprising the second upper work-function electrode pattern.

11. The semiconductor device of claim 5, wherein a width of the lower portion of the first metal electrode pattern in the first recess is less than a width of the lower portion of the second metal electrode pattern in the second recess, and
wherein a lowermost surface of the lower portion of the first metal electrode pattern in the first recess is higher than a lowermost surface of the lower portion of the second metal electrode pattern in the second recess relative to the upper surface of the substrate.

12. The semiconductor device of claim 5, further comprising a third gate electrode on the substrate, the third gate electrode comprising a third gate insulating pattern, a third work-function electrode pattern and a third metal electrode pattern that are sequentially stacked on the substrate,
wherein the third work-function electrode pattern comprises a recessed upper surface, and the third metal electrode pattern contacts the recessed upper surface of the third work-function electrode pattern, and
wherein the uppermost surface of the first lower work-function electrode pattern and an uppermost surface of the third work-function electrode pattern are at equal heights.

13. The semiconductor device of claim 12, wherein the first lower work-function electrode pattern, the second lower work-function electrode pattern and the third work-function electrode pattern comprise the same material.

14. The semiconductor device of claim 5, further comprising:
a first insulating pattern on the first gate electrode;
first spacers on opposing sides of the first gate electrode, respectively, an uppermost surface of the first insulating pattern and uppermost surfaces of the first spacers being at equal heights;
a second insulating pattern on the second gate electrode;
second spacers on opposing sides of the second gate electrode, respectively, an uppermost surface of the second insulating pattern and uppermost surfaces of the second spacers being at equal heights.

15. The semiconductor device of claim 14, wherein the first metal electrode pattern contacts the first spacers, and
wherein the second metal electrode pattern contacts the second spacers.

16. The semiconductor device of claim 14, wherein the first spacers and the second spacers comprise a material different from the first and second gate insulating patterns.

17. The semiconductor device of claim 5, further comprising:
first spacers on opposing sides of the first gate electrode, respectively; and
second spacers on opposing sides of the second gate electrode, respectively,
wherein an uppermost surface of the first metal electrode pattern is lower than uppermost surfaces of the first spacers, and
wherein an uppermost surface of the second metal electrode pattern is lower than uppermost surfaces of the second spacers.

18. The semiconductor device of claim 17, wherein the uppermost surface of the first metal electrode pattern and the uppermost surface of the second metal electrode pattern have equal widths.

* * * * *